US007843719B2

(12) United States Patent
Hung et al.

(10) Patent No.: US 7,843,719 B2
(45) Date of Patent: Nov. 30, 2010

(54) MAGNETIC SHIFT REGISTER AND DATA ACCESSING METHOD

(75) Inventors: Chien-Chung Hung, Taipei (TW); Kuei-Hung Shen, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 141 days.

(21) Appl. No.: 12/365,847

(22) Filed: Feb. 4, 2009

(65) Prior Publication Data
US 2010/0118583 A1    May 13, 2010

(30) Foreign Application Priority Data
Nov. 12, 2008    (TW) ................ 97143755 A

(51) Int. Cl.
*G11C 11/00*    (2006.01)
(52) U.S. Cl. .............. 365/158; 365/189.11; 365/189.14
(58) Field of Classification Search ............ 365/158, 365/189.11, 189.14, 189.15, 189.16
See application file for complete search history.

(56) References Cited
U.S. PATENT DOCUMENTS 6,205,047 B1 *    3/2001    Ogino ................ 365/145
6,834,005 B1    12/2004    Parkin
6,898,132 B2    5/2005    Parkin
6,955,926 B2    10/2005    Chen et al.
2006/0002180 A1 *    1/2006    Frey ................ 365/158

OTHER PUBLICATIONS

Article Titled "A novel SPRAM (SPin-transfer torque RAM) with a synthetic ferrimagnetic free layer for higher immunity to read disturbance and reducing write-current dispersion" jointly authored by Miura et al., in VLSI symposium, 2007, pp. 234-235.
Article Titled "Oscillatory dependence of current-driven magnetic domain wall motion on current pulse length" jointly authored by Thomas et al., in Nature, 443, pp. 197-200, 2006.

* cited by examiner

*Primary Examiner*—Son Dinh
(74) *Attorney, Agent, or Firm*—Jianq Chyun IP Office

(57) ABSTRACT

A magnetic shift register memory includes at least a magnetic memory track, in which multiple domain walls separate the memory track into multiple magnetic domains to serve as magnetic memory cells. A fixed number of the magnetic memory cells forms a memory unit to store a burst data. A read/write device is implemented between the memory units to read or write the burst data to the magnetic memory cells passing the read/write device. A flag unit records a flag value for each memory track or each memory unit to indicate whether the burst data is located at a first side or a second side of the read/write device. A current unit provides an operation current to the magnetic memory track according to the flag value to move the domain walls to pass the read/write device. After the read/write device reads or writes the burst data, the flag value is updated.

16 Claims, 21 Drawing Sheets

MAGNETIC SHIFT REGISTER AND DATA ACCESSING METHOD

CROSS-REFERENCE TO RELATED APPLICATION

This application claims the priority benefit of Taiwan application serial no. 97143755, filed Nov. 12, 2008. The entirety of the above-mentioned patent application is hereby incorporated by reference herein and made a part of specification.

BACKGROUND OF THE INVENTION

1. Field of the Invention

The present invention relates to a magnetic shift register memory and an accessing method thereof.

2. Description of Related Art

A magnetic random access memory (MRAM) has advantages of non-volatile, high density, high accessing speed and anti-radiation, etc., which can be used to substitute a conventional semiconductor memory and used for embedded memory applications. The conventional magnetic field writing MRAM device applies metal wires for conducting currents and inducing the magnetic field, so as to switch a free layer of the MRAM. However, as a size of the MRAM decreases, a demagnetizing field effect is quickly increased, and a required write current is greatly increased, so that miniaturization of the MRAM is difficult.

Recently, a spin-torque-transfer (STT) switching technique is provided according to the MRAM technique, which is also referred to as a spin-RAM technique. Such technique is a new generation of magnetic memory writing technique, by which the write current directly flows through a memory cell, and as a size of the memory cell decreases, the required write current accordingly decreases, so that such kind of memory can be perfectly miniaturized. However, such STT switching technique still has disadvantages of inadequate thermal stability of devices, excessive write current, and uncertainty of reliability, etc., resulting in enormous obstacles for mass production of such kind of memory.

In addition, a current-driven domain wall motion theory is gradually disclosed and well developed according to the conventional technique during 1998-2004. U.S. Pat. No. 6,834,005B1 provides a device structure which can greatly improve a data storage capacity of a chip or a hard disk, and the device structure is referred to as a magnetic shift register memory. Such kind of memory has a chance to substitute a current dynamic random access memory (DRAM), a static random access memory (SRAM) and a flash chip, and can even implement a technique of "disk drive on a chip". Such memory mainly applies a magnetic record disk similar to a hard disk, which is folded in a three-dimensional stack for storing data, in which the current drives a domain wall motion to record information therein. Therefore, an equivalent bit size thereof can be greatly reduced, and an operation speed thereof exceeds that of a solid flash chip and a hard disk.

FIGS. 1A-1C are operational schematic diagrams of a conventional magnetic shift register. A shift register memory 100 includes a bit storage region 35, a bit reservoir region 40, a write device 15 and a read device 20 and a track 11 for storing and moving data. The track 11 of the shift register memory 100 is formed by a magnetic metal material such as ferromagnetic materials of NiFe, and CoFe, etc. The track 11 can be magnetized into a plurality of small magnetic domains 25 and 30. Directions of magnetization vectors of the magnetic domains represent logic values 0 and 1 of the stored information. The track 11 of the shift register memory 100 is serially connected to adjacent tracks. A memory region is separated by one set of the write device 15 and the read device 20, and each of the memory regions includes the bit storage region 35 and the bit reservoir region 40. During a quiescent state for storing information, i.e., a stable state without the current being applied to drive a domain wall motion, data of the memory cells (for example, the magnetic domain 25 represents data 0 and the magnetic domain 30 represents data 1) are sequentially stored in the bit storage region 35. Now, none information is stored in the bit reservoir region 40. The read device 20 of the magnetic shift register memory is connected to the track 11 via a magnetic tunnelling junction (MTJ), and when the sequential bit information is about to be read, a current pulse 45 is input to drive each of the magnetic domains 25 and 30 to generate a domain wall motion (DWM) towards a direction of the electron flow.

FIG. 1B illustrates a transient state, in which the bit information located closest to the read device 20 can be read. In the transient state, the previously read bit information is shifted into the bit reservoir region 40. After all of the bit information stored in the bit storage region 35 is read, all of the bit information is shifted to the bit reservoir region 40. Then, an inverted current pulse 45 is input to shift all of the bit information back to the bit storage region 35. When data is written into the magnetic shift register memory, the magnetic domain to be written is also shifted to a position where the write device 15 is located by inputting the current pulse 45, and now the write device 15 also shifts a stray field of a specific direction to a write position via another writing line according to the Ampere's field or DWM scheme, so that the magnetic domain is switched to a direction of the data to be written. Thereafter, the sequential information of the magnetic domain is shifted back to an original position via the inverted current pulse 45. According to a common knowledge of the memory, the read device 20 is connected to a sense amplifier through a select transistor (which can be a MOS transistor), wherein the transistor occupies a physical area of a Si substrate. Sizes of the magnetic domains 25 and 30 are generally far more smaller than that of the transistor, so that an equivalent bit size of the magnetic shift register memory is mainly determined by the size of the transistor and a number of the bit information (25 and 30) stored in the bit storage region 35 that is controlled by the transistor. Since the magnetic shift register memory includes a plurality of bits, the equivalent bit size can be greatly reduced.

FIG. 2 is a schematic diagram illustrating a mechanism of the magnetic shift register of FIGS. 1A-1C. Referring to FIG. 2, for simplicity's sake, the shift register memory 100 can be extended on a straight track, which includes the bit storage region 35 and the bit reservoir region 40 respectively containing a plurality of the magnetic domains 25 and 30. Assuming in FIG. 2, one bit storage region 35 of the shift register memory 100 records data of four bits that can be shifted to the bit reservoir region 40. FIG. 3 is a schematic diagram illustrating a read mechanism. Referring to FIG. 3, a current pulse 106 is, for example, input to the shift register memory 100, so that the magnetic domains 102 and 104 are shifted, and a reading circuit 108 can read bit data from one of the magnetic domains passing through a position where the reading circuit 108 is located. Data to be written into the magnetic domain can be written by a writing circuit.

Basically, design of the conventional magnetic shift register memory is still not ideal, and the magnetic shift register memory technique is still in an early stage of development, which requires further improvement.

Regarding the aforementioned structure and the read/write mechanism, the memory cells are generally shifted for reading or writing data. After read or write of the data is completed, the memory cells are shifted back to original positions, so that a time for shifting the memory cells back to the original positions is wasted.

FIG. 4 is a schematic diagram illustrating a mechanism of a conventional read operation. Referring to FIG. 4, one clock cycle of a clock signal CLK is, for example, 10 ns. A position of the memory cell is, for example, determined according to an address signal Addr, and an address A1 is activated at a time point 400. Thereafter, a write enable signal WE represented by a compensation signal $\overline{WE}$ of WE is set to be disabled. An output enable signal (OE) represented by a compensation signal $\overline{OE}$ of OE is activated within one clock cycle after the address A1 is activated. Meanwhile, after the output enable signal is activated, the domain walls are moved in response to a current pulse (WL pulse). For example, the domain walls are sequentially moved forward for n positions to a buffer region during a time section 404, and are sequentially moved backward for the n positions during a time section 406 to move the memory cells from the buffer region back to original positions thereof. During the time section 404, a burst data to be read contains n bits data. Therefore, regarding a signal DIO on a data input/output pin (DIO pin), data reading is performed at the time point 402, and a read operation is completed during a time section 410. Next, another read operation is completed during a time section 414.

In such magnetic memory structure, besides the selected memory unit is determined according to an address (x, y), one memory unit contains n-bit burst data, which is represented by (z).

FIG. 5 is a schematic diagram illustrating a mechanism of a conventional write operation. Referring to FIG. 5, the operation mechanism thereof is similar to that of FIG. 4, in which waveforms of the write enable signal WE and the output enable signal OE are exchanged, and a write operation is completed during a time section 416, while another write operation is further completed during a time section 418. The domain walls are moved in response to the peripheral current pulse signal (WL pulse). For example, the domain walls are sequentially moved forward for n positions to the buffer region during a time section 420, and are sequentially moved backward for the n positions during a time section 422 to move the memory cells from the buffer region back to the original positions.

The aforementioned conventional read and write operations all require the time section 406 or the time section 422 to move the memory cells back to the original addresses, so that an operation time thereof is increased, and an operation speed thereof is decreased.

How to improve the operation speed is one of the major subjects in research and development of the shift register memory.

SUMMARY OF THE INVENTION

The present invention provides a magnetic shift register memory including at least one magnetic memory track, in which a plurality of domain walls separates the magnetic memory track into a plurality of magnetic domains to form a plurality of magnetic memory cells. A fixed number of the magnetic memory cells forms a memory unit to store a burst data. A read/write device is disposed between the memory units to read or write the burst data of the magnetic memory cells passing the read/write device. A flag unit records a flag value for each magnetic memory track or each memory unit to indicate whether the burst data is located at a first side or a second side of the read/write device. A current unit provides an operation current to the magnetic memory track according to the flag value to move the domain walls to pass the read/write device. After the read/write device reads or writes the burst data, the flag value is updated.

The present invention provides a method for accessing a magnetic shift register memory. The magnetic shift register memory for example includes at least one magnetic memory track, in which a plurality of domain walls separates the magnetic memory track into a plurality of magnetic domains to form a plurality of magnetic memory cells. A fixed number of the magnetic memory cells forms a memory unit to store a burst data. A reading/write device is disposed between the memory units, and the magnetic memory track or each of the memory units has a corresponding flag value to indicate whether the burst data is located at a first side or a second side of the read/write device. The method includes following steps. First, the flag value of the magnetic memory track or the memory unit to be read/written is obtained. Next, an operation current is provided to the magnetic memory track to shift the domain walls to pass the read/write device according to the flag value. Finally, after the read/write device reads or writes the burst data of the passed magnetic memory cells, the flag value is updated.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention provides a magnetic shift register memory with a high data transmission rate, in which each word line or each memory unit has a flag signal recording whether a storage position of a corresponding burst data is located at one side or another side of a read/write device. A current source driving a domain wall motion (DWM) of a word line can determine a polarity of a current to be applied by checking a state of the flag signal. The magnetic shift register memory can have a double data transmission rate, and can input/output data according to a burst mode.

The present invention provides a method for accessing the magnetic shift register memory, by which at least a time for moving back memory cells to original addresses in a conventional read and write mechanism is saved according to a flag setting mechanism, so as to improve an operation speed thereof.

In the following content, embodiments are provided to describe the present invention, though the present invention is not limited to the provided embodiments, and the provided embodiments can be mutually combined to form another embodiment.

Figure 6:
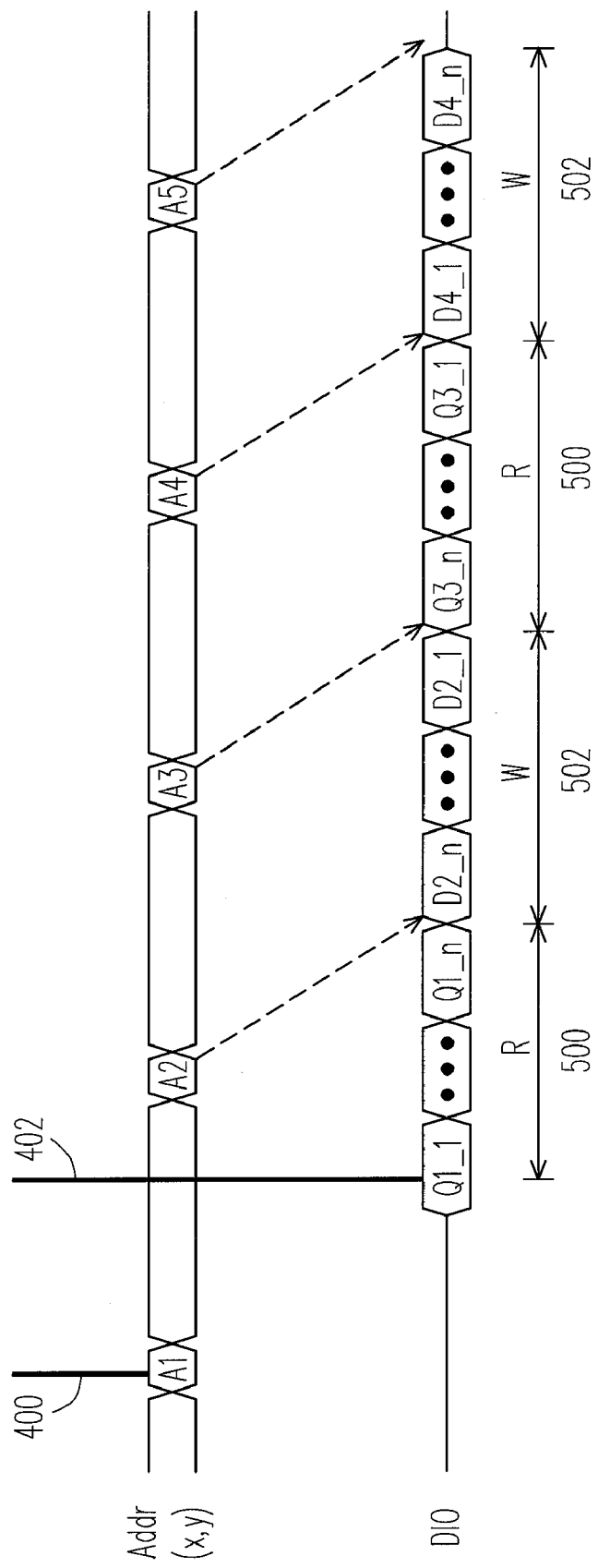
FIG. 6 is a schematic diagram illustrating an operation mechanism according to an embodiment of the present invention.

FIG. 6 is a schematic diagram illustrating an operation mechanism according to an embodiment of the present invention. Referring to FIG. 6, in the present invention, after the read or write operation is completed, the memory cells are not required to be shifted back to the original positions as that does in a conventional mechanism, so that waste of the operation time is avoided, and the operation speed can be improved. When the read/write operation is activated at a time point 400, after an initial latency, read data or written data is start to be transmitted though a data input/output pin DIO at a time point 402. In other words, a read time section 500 and a write time section 502 can be interactively activated, freely, so as to perform a series of read/write operations. During which, idle time sections existed in the conventional mechanism can be avoided. Namely, in the present invention, moving back the memory cells to fixed positions of the originally set addresses for each read or write operation is unnecessary.

Figure 7:
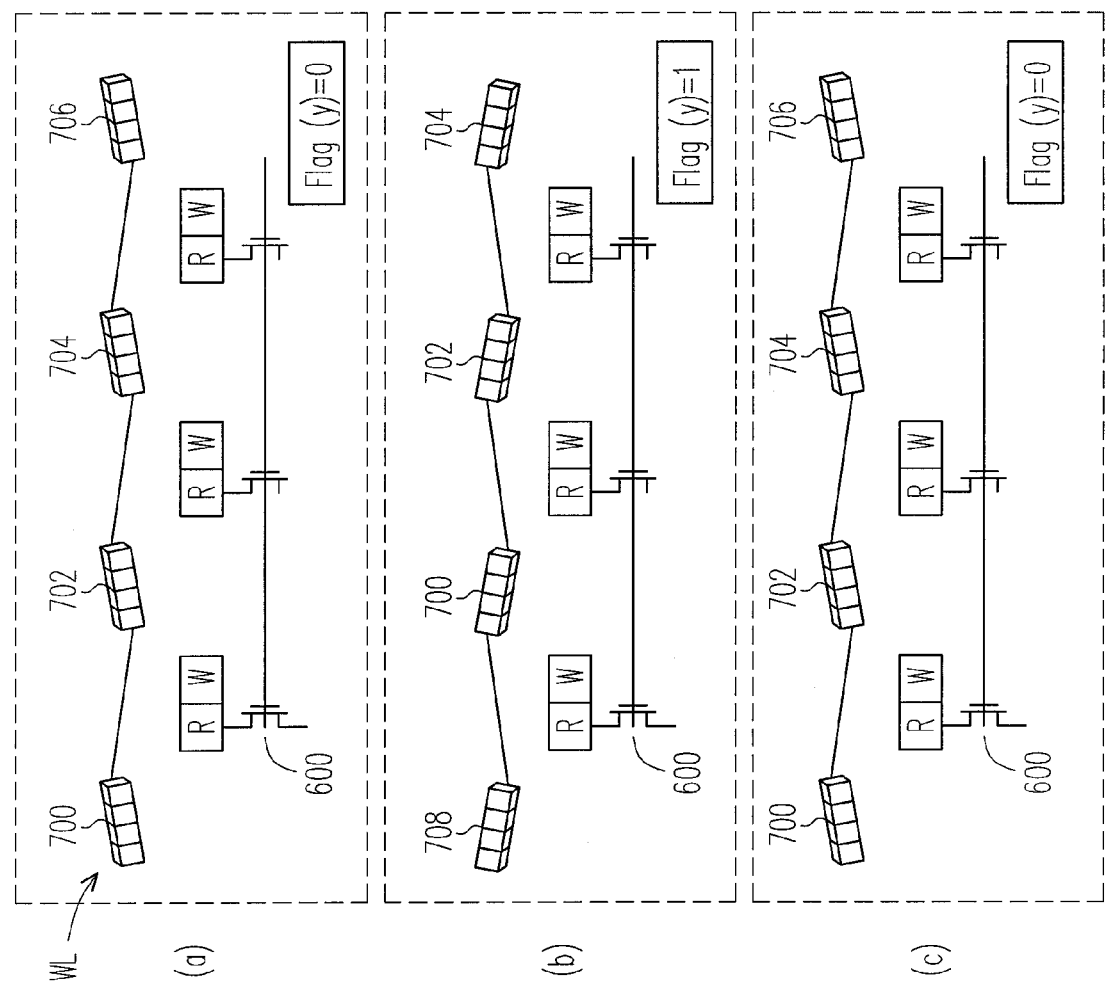
FIG. 7 is a schematic diagram illustrating a mechanism of a magnetic shift register memory with a high data transmission rate according to an embodiment of the present invention.

FIG. 7 is a schematic diagram illustrating a mechanism of a magnetic shift register memory with a high data transmission rate according to an embodiment of the present invention. The magnetic shift register memory includes at least a magnetic memory track, which is, for example, a magnetic nano line serving as a word line (WL). The magnetic nano lines used for data storage can be connected in series, and a driving current pulse for driving a DWM is provided from external. However, in some cases, to avoid a problem of excessive resistance value due to the excessively long magnetic nano lines, the magnetic nano lines are not necessarily to be connected in series.

The word line, for example, includes a plurality of memory units 700-706. Multiple domain walls separate each of the magnetic memory units into a plurality of magnetic domains to form a plurality of magnetic memory cells, and 4 magnetic memory cells are taken as an example in FIG. 7. Actually, a fixed number of the magnetic memory cells forms a memory unit to store a burst data, wherein the burst date includes n bits data. A read/write device 600 is disposed between the memory units to read or write the burst data of the magnetic memory cells passing the read/write device 600. A flag unit records a flag value for each magnetic memory track or each memory unit to indicate whether the burst data is located at a first side or a second side of the read/write device 600. For example, 0 or 1 of the flag value represents the two states.

In FIG. 7($a$), a current unit provides an operation current to the magnetic memory track (WL) according to the states of the flag value to move the domain walls to pass the read/write device 600. Next, in FIG. 7($b$), after the read/write device 600 reads or writes the burst data from/to the memory units, the flag value is updated for Flag=1. Now, since the memory cells are, for example, moved rightwards (in terms of FIG. 7) for one memory unit, the memory unit 706 is moved out of a range of the figure, and a memory unit 708 of another side is moved into the range of the figure. The flag value traces and records positions of the memory units relative to the read/write device 600. Due to tracing of the flag value, a state of FIG. 7($b$) can be maintained, and is unnecessary to be immediately recovered to the state of FIG. 7($a$).

Next, if the read/write operation is again performed in allusion to the state of FIG. 7($b$), since the flag value thereof is 1, i.e., the state of Flag=1, the domain walls of the magnetic memory track (WL) are shifted to a left side. After the operation is completed, FIG. 7($c$) is obtained, by which the state of FIG. 7($a$) is recovered. In other words, in FIG. 7($c$), while the memory cells are shifted back to the state of FIG. 7($a$), the read/write operation can be simultaneously performed to change logical data of the memory cells.

If the burst data takes z as an address of the memory cell, the corresponding flag value is directional. When the burst data is initially located at the left side, the bit accessed via the DWM is a first bit, and when the burst data is initially located at the right side, the bit accessed via the DWM is then a last bit. Therefore, input/output of the burst data has to be performed according to the state of the flag value to determine whether a sequence of the burst data is inversed, so as to avoid errors. Inversing of the sequence of the burst data can be implemented according to an internal or an external processing of the memory, which is described in detail in a following embodiment.

There are several manners for recording the flag values. To still maintain the actual relative storage positions of the burst data after the power of the memory is turned off, a non-volatile memory, such as a flash memory or a magnetic memory can be applied for storing the flag values. After the memory chip is turned on, the stored flag value can be loaded to a memory with a relatively fast accessing speed, for example, a static random access memory (SRAM) latch or a SRAM register for operation. According to another method, the non-volatile memory is not applied for storing the flag values, but during a process of turning off the memory chip, all of the flag value signals are inspected, and all of the burst data are shifted back to original values thereof. Namely, the memory chip is turned off while confirming all of the flag values have a state of Flag=0. In this case, each time when the memory chip is turned on, it can be immediately utilized, and loading of the states of the flag value from the non-volatile memory is unnecessary.

Since the storage positions of the burst data are recorded by the states of the flag value, which are similar to a seesaw as that shown in FIG. 7, it is referred to as a domain wall seesaw (DW-seesaw). Such magnetic shift register memory can have a double data transmission rate, and data can be input/output in a burst mode, so that an operation efficiency of a system thereof can be greatly improved.

Figure 8:
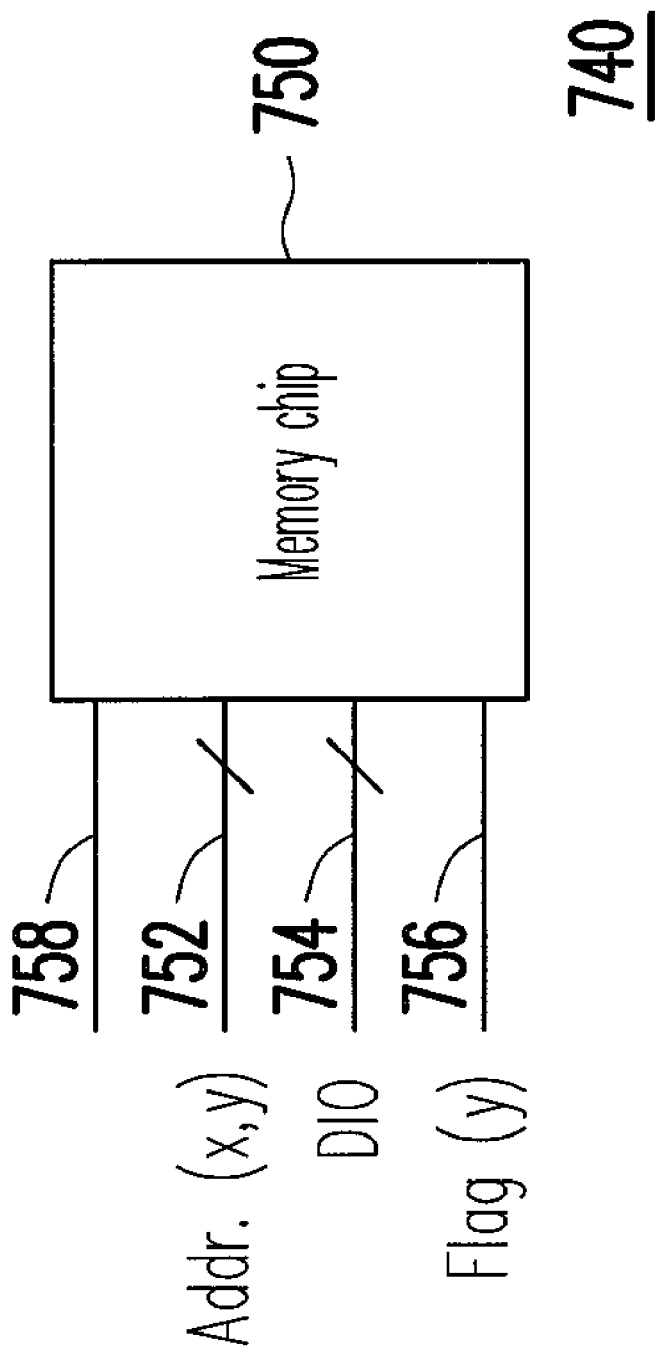
FIG. 8 is a schematic diagram illustrating a memory chip which performs burst data inversing based on an external processing according to an embodiment of the present invention.

In the following content, how to output a correct data according to the internal or the external processing is described in an embodiment. FIG. 8 is a schematic diagram illustrating a memory chip which performs the burst data inversing based on the external processing according to an embodiment of the present invention. Referring to FIG. 8, a data system 740 includes a magnetic memory chip 750 of the present invention. The memory chip 750 selects and activates an address (x, y) of the memory unit to be read/written via an Addr pin 752. A DIO pin 754 is used for transmitting or receiving data. Due to the external processing, a Flag pin 756 is used for outputting the flag values. Another pin 758 can be used for other utilizations.

Figure 9:
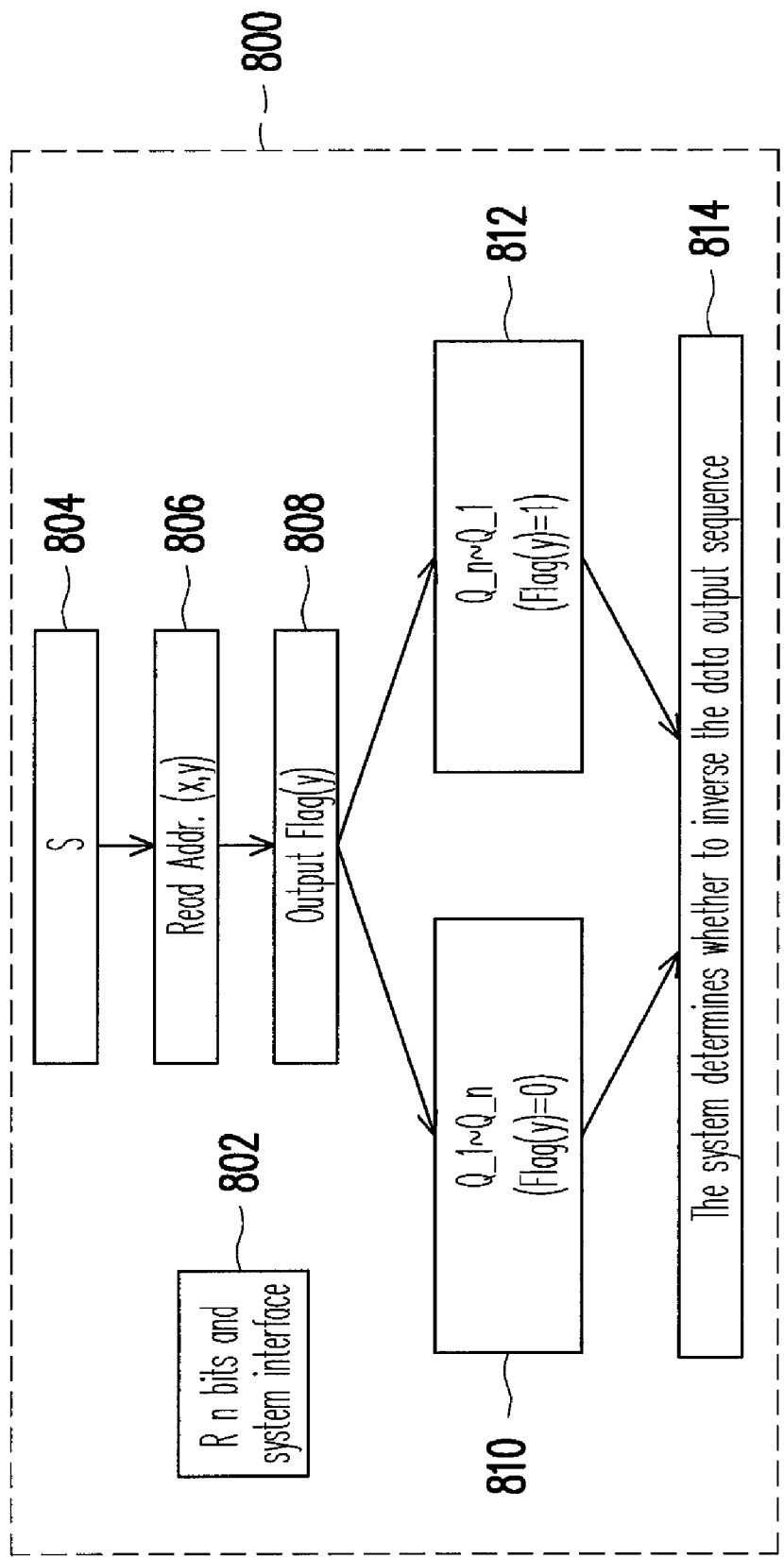
FIG. 9 is a flowchart illustrating a read operation of an external processing according to an embodiment of the present invention.

FIG. 9 is a flowchart illustrating a read operation of the external processing according to an embodiment of the present invention. Referring to FIG. 9, in a data read flow 800, n bits data is read via a system interface 802 connected to a system. First, in step 804, the system (S) is connected to the system interface 802. In step 806, the address (x, y) of the burst data to be read is selected and activated. In step 808, the memory chip 750 outputs the corresponding flag value Flag (y). In step 810, if the flag value is Flag(y)=0, it represents that the sequence of the output burst data is $Q\_1$-$Q\_n$. In step 812, if the flag value is Flag(y)=1, it represents that the sequence of the output burst data is $Q\_n$-$Q\_1$. In step 814, an external data processing system can determine whether or not to inverse the data output sequence according to the states of the flag value, so as to adjust the sequence of the data. For example, the sequence the burst data with the flag value of Flag(y)=1 is required to be inversed.

Figure 10:
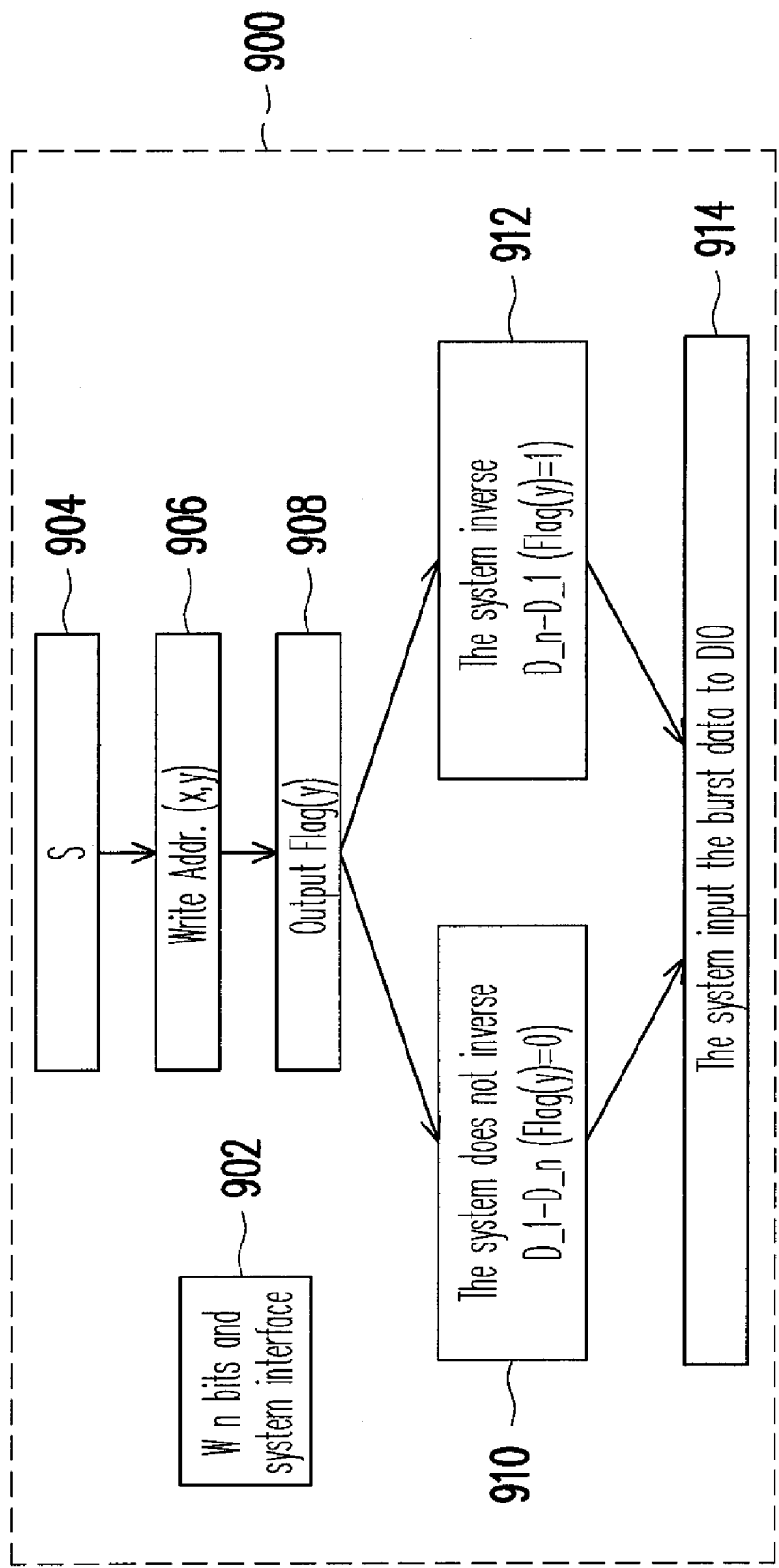
FIG. 10 is a flowchart illustrating a write operation of an external processing according to an embodiment of the present invention.

FIG. 10 is a flowchart illustrating a write operation of the external processing according to an embodiment of the present invention. Referring to FIG. 10, in a data write flow 900, n bits data is written via a system interface 902 connected to a system. First, in step 904, the system (S) is connected to the system interface 902. In step 906, the address (x, y) to be written with the burst data is selected and activated. In step 908, the memory chip 750 outputs the corresponding flag value Flag(y). In step 910, if the flag value is Flag(y)=0, it represents that the sequence of the burst data to be written is $D\_1$-$D\_n$, and inversing of the data sequence is not required. In step 912, if the flag value is Flag(y)=1, it represents that the sequence of the burst data to be written is $D\_n$-$D\_1$, so that the system inverses the data sequence. In step 914, the system processes the data sequence according to the states of the flag value, and inputs the burst data to the DIO pin 754 to perform the write operation.

Figure 11:
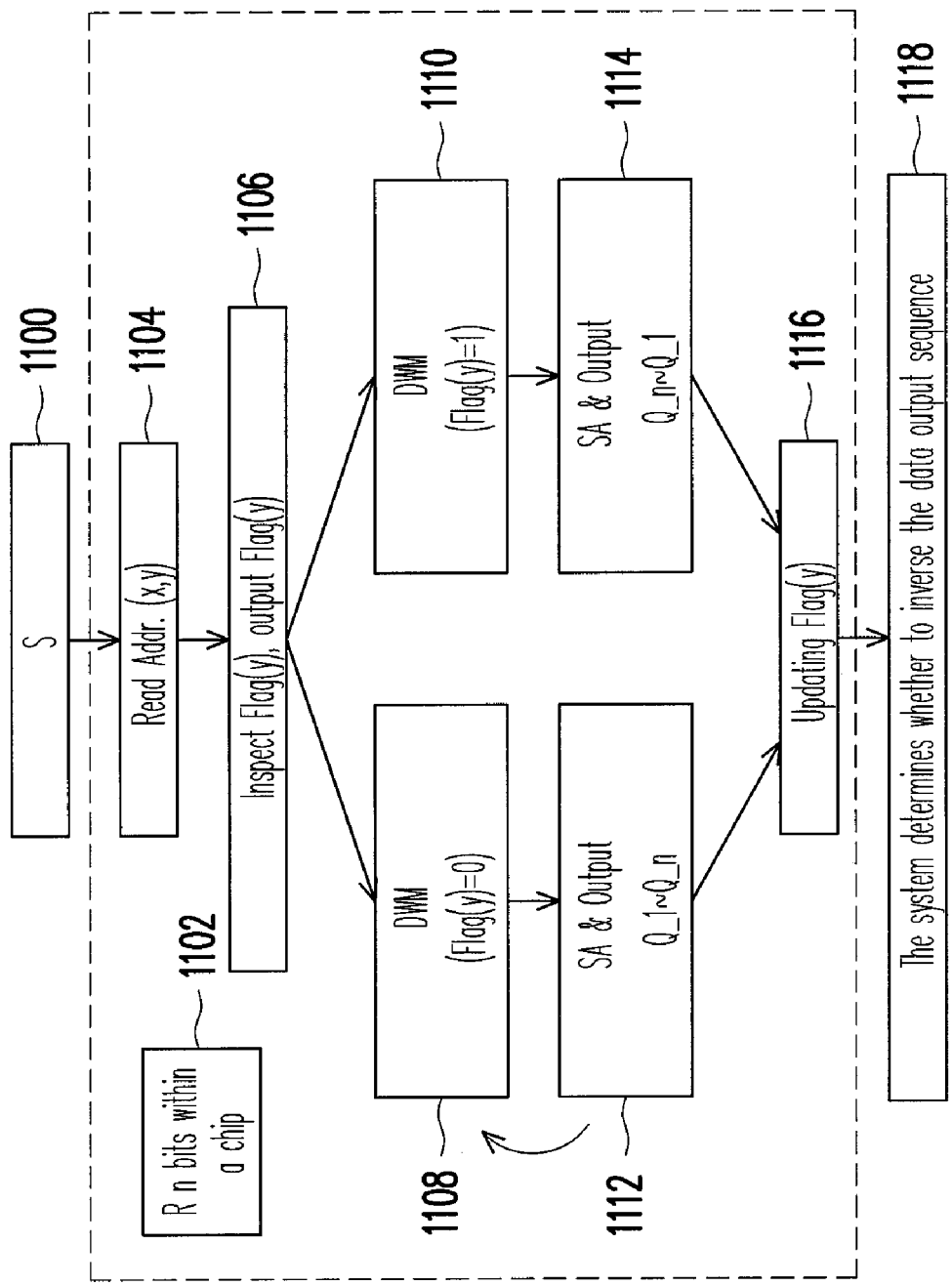
FIG. 11 is a flowchart illustrating a read operation of an external processing according to an embodiment of the present invention.

FIG. 11 is a flowchart illustrating a read operation of the external processing according to an embodiment of the present invention. Referring to FIG. 11, it is a more detailed flowchart of the read operation. The system (s) is connected to a system interface 1102 disposed in the chip to read n bits data. In step 1100, the system (S) is connected to the system interface 1102. In step 1104, the address (x, y) of the burst data to be read is selected and activated. In step 1106, the flag value Flag(y) is checked and the corresponding flag value Flag(y) is output. In step 1108, if the state of the flag value is Flag(y)=0, a positive direction DWM is activated, and a current pulse thereof is a positive value. In step 1110, if the state of the flag value is Flag(y)=1, a negative direction DWM is activated, and the current pulse thereof is a negative value. Here, the positive/negative direction of the DWM and the positive/negative direction of the current pulse can be determined according to different definitions, and the positive direction of the current pulse is the opposite direction of the electron flow and can also be defined the same to the positive direction of the DWM. Continued with the step 1108, in step 1112, the data stored in the memory cell is read by sensing magnetoresistance of the memory cell via a device such as a sense amplifier (SA), etc., wherein the data has a sequence of $Q\_1$-$Q\_n$, and is output according to such sequence. Continued with the step 1110, in step 1114, the data stored in the memory cell is read by sensing the magnetoresistance of the memory cell, wherein the data has a sequence of $Q\_n$-$Q\_1$, and is output according to such sequence. Since the data sequence is adjusted by the external processing, the output sequence of the data is maintained to $Q\_n$-$Q\_1$. In step 1116, regarding the read memory unit, a position thereof relative to the read device is changed, so that the flag value thereof is required to be updated. In step 1118, the external system determines whether the output sequence of the data is inversed according to the flag value output based on the step 1106.

Figure 12:
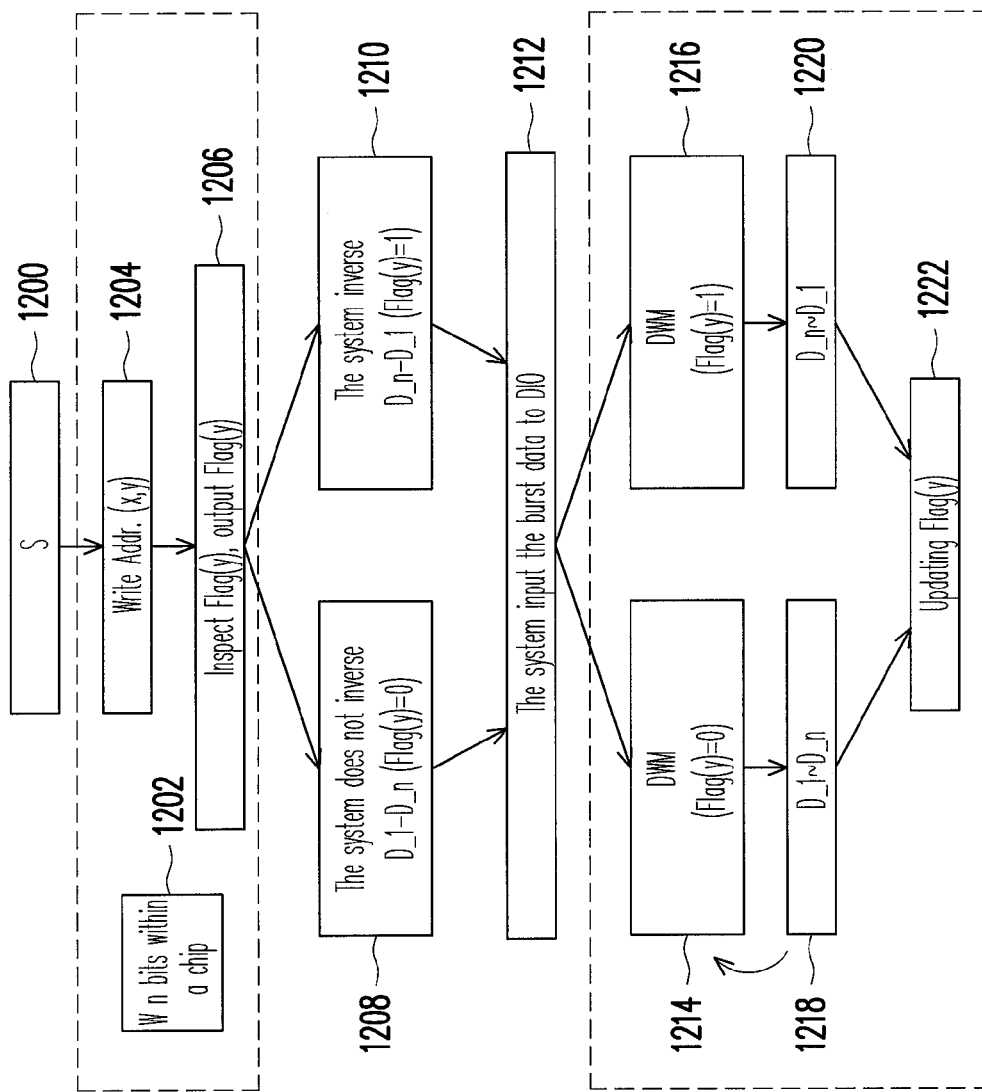
FIG. 12 is a flowchart illustrating a write operation of an external processing according to an embodiment of the present invention.

FIG. 12 is a flowchart illustrating a write operation of the external processing according to an embodiment of the present invention. Referring to FIG. 12, it is a more detailed flowchart of the write operation. In the present embodiment, n bits (W n bites) data is written via a system interface 1202 connected to a system. First, in step 1200, the system (S) is connected to the system interface 1202. In step 1204, the address (x, y) to be written with the burst data is selected and activated. In step 1206, the corresponding flag value Flag (y) is checked, and the memory chip 750 outputs the flag value Flag(y). In step 1208, if the flag value is Flag(y)=0, it represents that the sequence of the burst data to be written is $D\_1$-$D\_n$, and inversing of the data sequence is not required. In step 1210, if the flag value is Flag(y)=1, it represents that the sequence of the burst data to be written is $D\_n$-$D\_1$, so that the system inverses the data sequence. In step 1212, the system inputs the burst data having the corresponding sequence to the DIO pin.

The actual write operation is described in the following steps. In step 1214, the state of the corresponding flag value is Flag(y)=0, so that the domain walls are moved towards the positive direction, and a current pulse thereof is a positive value. In step 1216, the state of the corresponding flag value is Flag(y)=1, so that the domain walls are moved towards the negative direction, and the current pulse thereof is a negative value. Continued with the step 1214, in step 1218, the burst data $D\_1$-$D\_n$ are written, and continued with the step 1216, in step 1220, the burst data $D\_n$-$D\_1$ are written. In step 1222, the burst data is moved from one side of the read/write device to the other side, so that the flag value Flag(y) is correspondingly updated.

Figure 13:
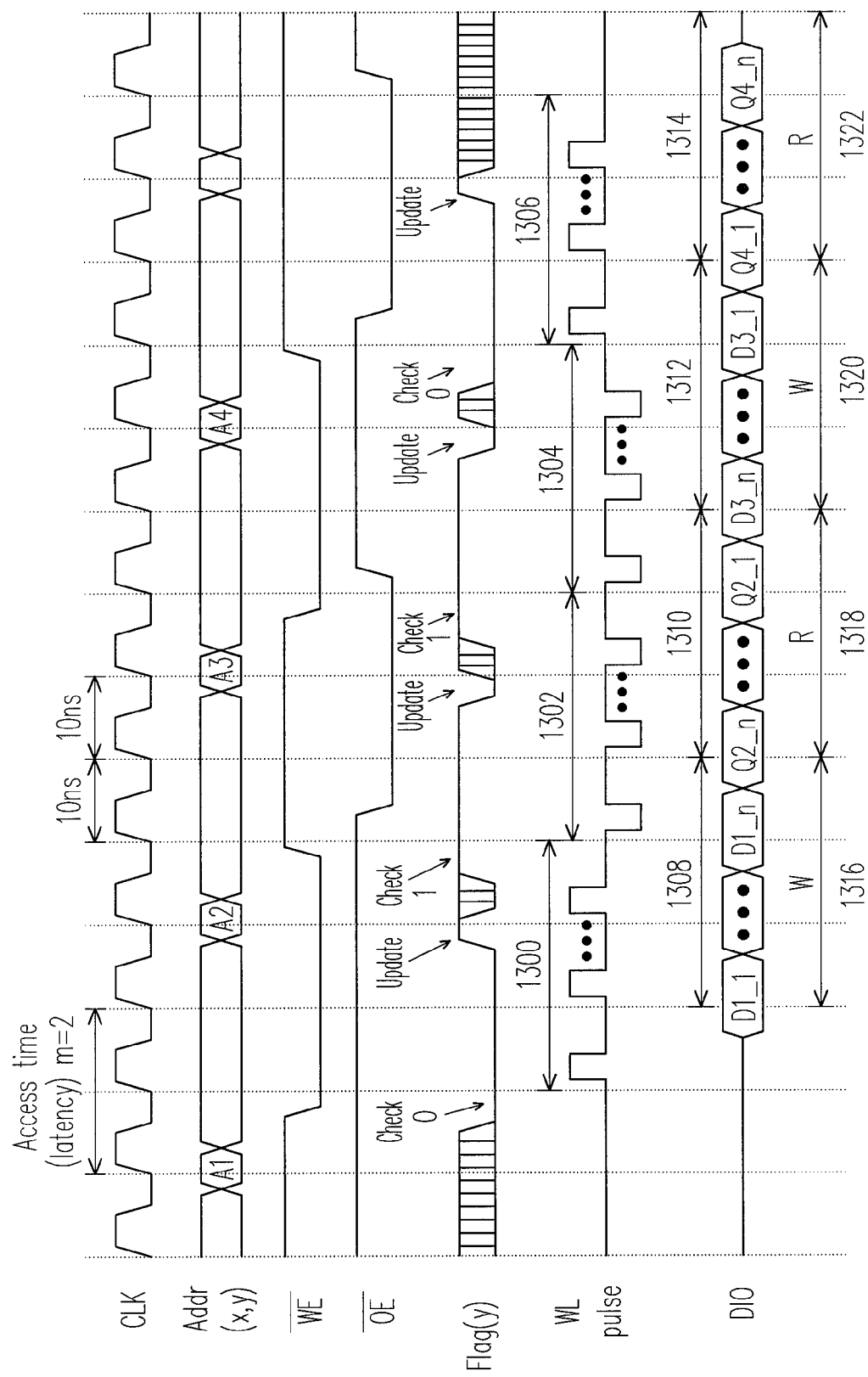
FIG. 13 is a timing diagram of operation signals according to an embodiment of the present invention.

FIG. 13 is a timing diagram of operation signals according to an embodiment of the present invention. Referring to FIG. 13, the system, for example, performs the write, read, write and read (W, R, W, R) operations in allusion to four addresses A1-A4. After the address A1 is activated, the flag value is first checked and the corresponding signal thereof is sent. After a latency of two clock cycles (m=2), the DIO data is started to be input or output, and after the read or write operation, the signal of Flag(y) is correspondingly updated to change the flag value. The operation current pulse (WL pulse) corresponds to Flag(y)=0 in a time section 1300, so that n positive pulses are input, and change of data sequence is not required. Therefore, the burst data of D1_1-D1_n are input to the DIO pin, and domain walls are moved in response to the current pulse (WL pulse), and accordingly the burst data is written into the memory cells by the write device, which is referred to as a write time section 1316. Thereafter, a next burst data corresponds to the address A2. By changing the states of the WE and OE signals, the read operation is performed. The flag value is checked to be Flag(y)=1, and the current pulse (WL pulse) corresponds to Flag(y)=1 in a time section 1302, so that n negative pulses are input. Then, the burst data Q2_n-Q2_1 are read during a read time section 1318. According to the same mechanism, the current pulses (WL pulse) are input during time sections 1304 and 1322 according to the states of the flag value Flag(y), so that the burst data D3_n-D3_1 are written during a time section 1320, and the burst data Q4_1-Q4_n are read during a time section 1322.

In the above read/write mechanism, the data sequence is changed by the external system, so that if such mechanism is intended to be widely applied to current data systems, for example, computer systems, additional processing interfaces are required, or management of data accessing thereof is required to be changed. However, to simply compatible to various current systems, management of the data sequence can also be set to internal of the chip. Next, embodiments for internal processing of the data sequence are provided below.

Figure 14:
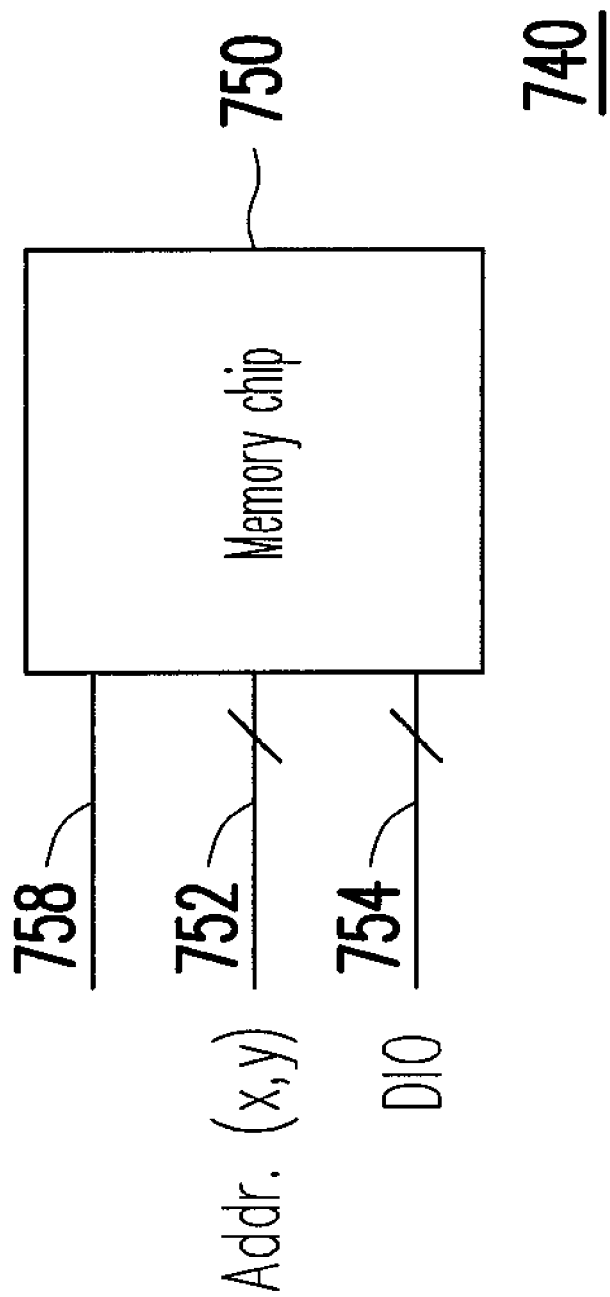
FIG. 14 is a schematic diagram illustrating an internal processing memory chip according to an embodiment of the present invention.

FIG. 14 is a schematic diagram illustrating an internal processing memory chip according to an embodiment of the present invention. Referring to FIG. 14, communication between the system 740 and the internal processing memory chip 750 only requires the address pin Addr. (x, y), the DIO pin and the other functional pin 758. Since the data sequence is internally processed, the data transmitted by the memory chip 750 all have a predetermined sequence, so that the flag pin is not required.

Figure 15:
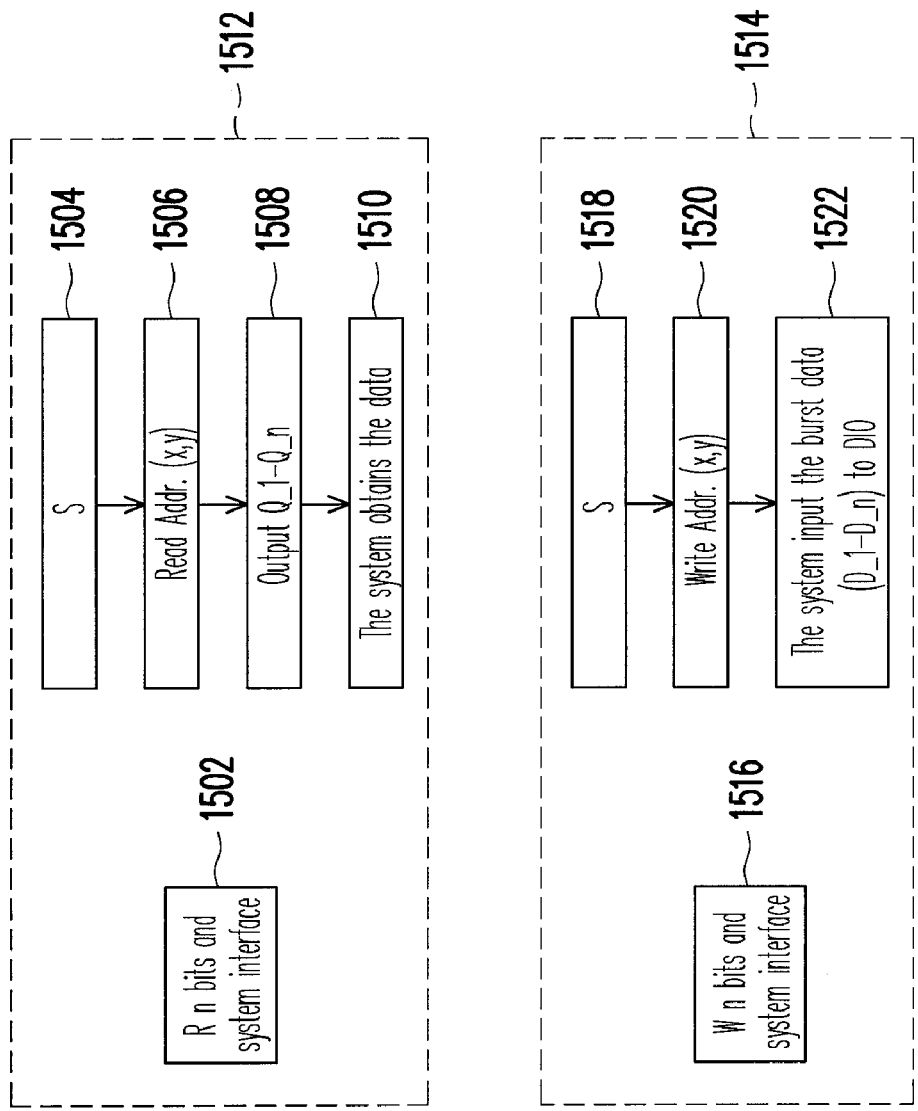
FIG. 15 is a flowchart illustrating a read/write operation of an internal processing according to an embodiment of the present invention.

FIG. 15 is a flowchart illustrating a read/write operation of the internal processing according to an embodiment of the present invention. Referring to FIG. 15, for a data read flow 1512, in step 1504, the system (S) is connected to a system interface 1502 to read n bits (R n bits) data. In step 1506, the address Addr (x, y) of the burst data to be read is selected and activated. In step 1508, after the internal processing of the data sequence, the burst data Q_1-Q_n are output, which are accorded to a general data sequence. In step 1510, the system directly obtains the data via the DIO pin. In other words, for the system, consideration of the states of the flag value is unnecessary.

For a data write process 1514, in step 1518, the system (S) is connected to a system interface 1516 to write n bits (W n bits) data. In step 1520, the address Addr (x, y) to be written with the burst data is selected and activated. In step 1522, the system input the burst data D_1-D_n to be written to the DIO pin. In other words, for the system, consideration of the states of the flag value is unnecessary.

Figure 16:
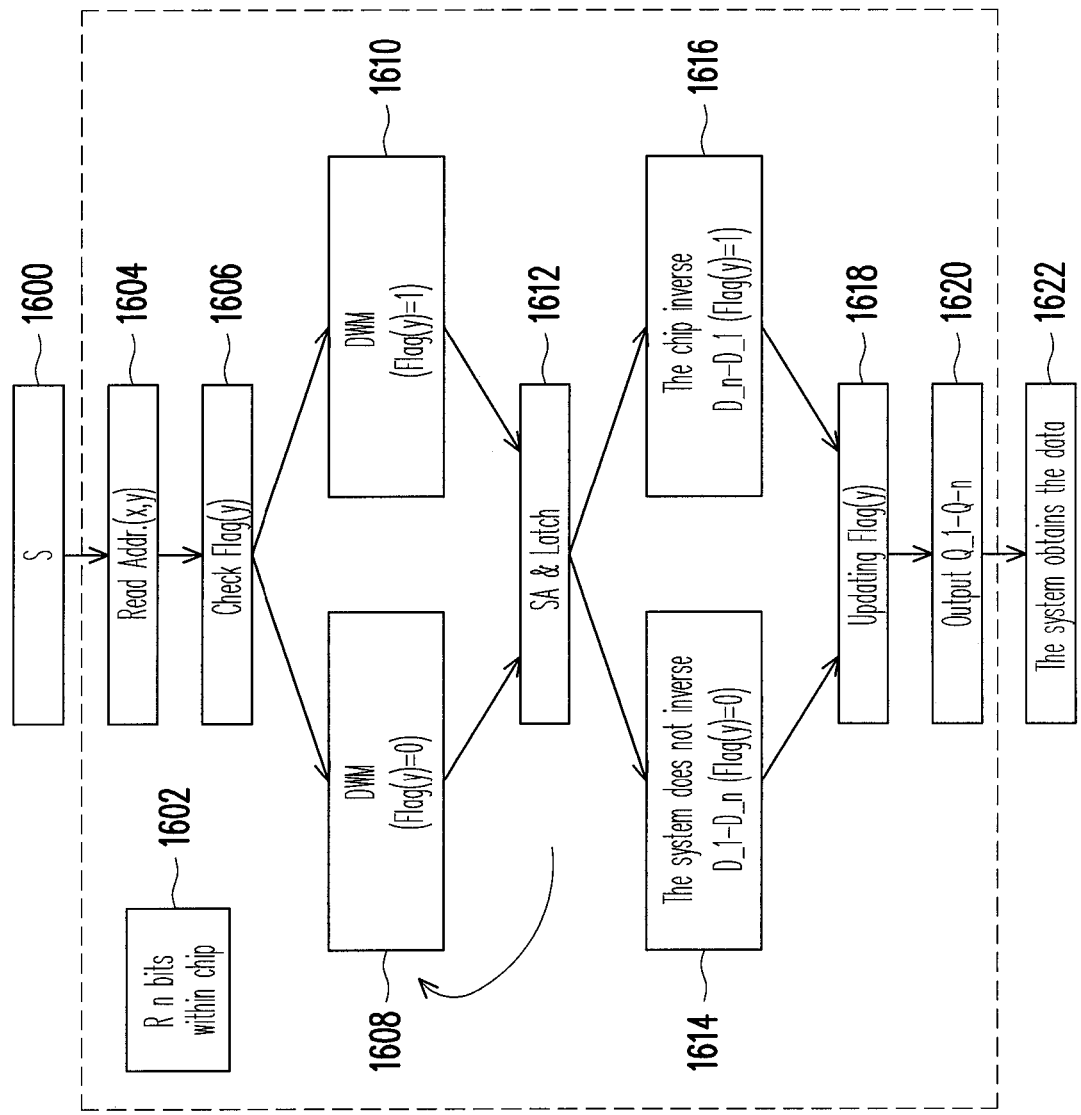
FIG. 16 is a flowchart illustrating a read operation of an internal processing according to an embodiment of the present invention.

FIG. 16 is a flowchart illustrating a read operation of the internal processing according to an embodiment of the present invention. Referring to FIG. 16, according to the data read flow 1512 of FIG. 15, a more detailed read flow is provided below. The system (S) is connected to a system interface 1602 disposed within the chip to read n bits data. In step 1600, the system (S) is connected to a system interface 1602. In step 1604, the address (x, y) of the burst data to be read is selected and activated. In step 1606, the flag value Flag(y) is checked. In step 1608, if the state of the flag value is Flag(y)=0, the positive direction DWM is activated, and a current pulse thereof is a positive value. In step 1610, if the state of the flag value is Flag(y)=1, the negative direction DWM is activated, and the current pulse thereof is a negative value. In step 1612, the data stored in the memory cell is read by sensing magnetoresistance of the memory cell via a device such as a sense amplifier (SA), etc., and the read data is latched, namely, such burst data is temporarily stored. In step 1614, in case that the state of the flag value is Flag(y)=0, the burst data thereof is maintained to the sequence of Q_1-Q-n, and inversing of the data sequence is unnecessary. In step 1616, in case that the state of the flag value is Flag(y)=1, the read data has the sequence of Q_n-Q-1, so that inversing of the data sequence is required. In step 1618, the state of the flag value is updated. In step 1620, the output sequence of the data is maintained to Q_1-Qn. In step 1622, the system directly obtains the data, and consideration of the states of the flag value is unnecessary.

Figure 17:
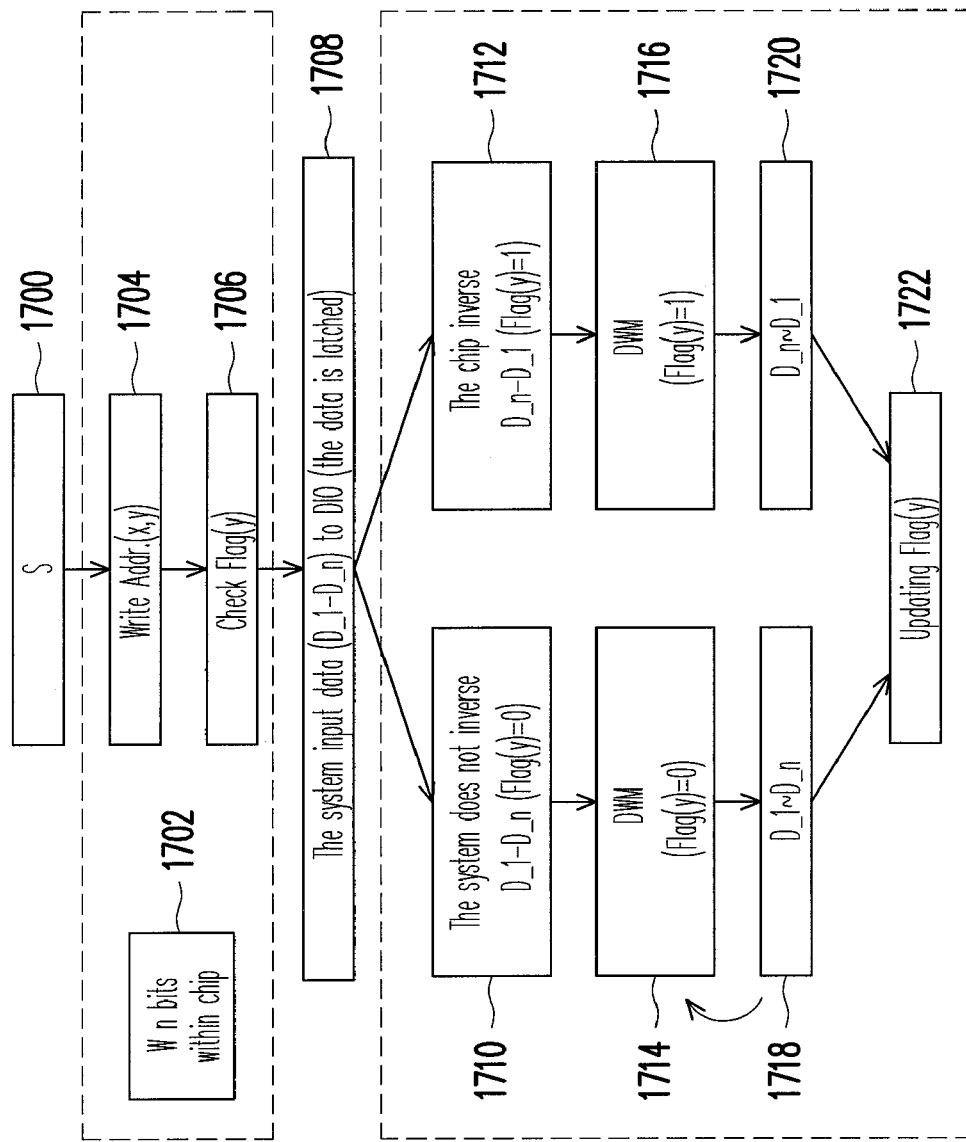
FIG. 17 is a flowchart illustrating a write operation of an internal processing according to an embodiment of the present invention.

FIG. 17 is a flowchart illustrating a write operation of the internal processing according to an embodiment of the present invention. Referring to FIG. 17, according to the data write flow 1514 of FIG. 15, a more detailed write flow is provided below. In the present embodiment, n bits (W n bites) data is written via a system interface 1702 connected to the system. First, in step 1700, the system (S) is connected to the system interface 1702. In step 1704, the address (x, y) to be written with the burst data is selected and activated. In step 1706, the corresponding flag value Flag (y) is checked. In step 1708, the system inputs the burst data D_1-D_n to the DIO pin, wherein the burst data D_1-D_n is temporarily latched. In step 1710, if the flag value is Flag(y)=0, the sequence of the latched burst data D_1-D_n is unnecessary to be inversed. In step 1712, if the flag value is Flag(y)=1, the sequence of the latched burst data D_1-D_n is required to be inversed to D_n-D_1, so that the internal system inverses the data sequence. Continued with the step 1710, in step 1714, if the state of the flag value is Flag(y)=0, the positive direction DWM is activated, and the current pulse thereof is a positive value. Continued with the step 1712, in step 1716, if the state of the flag value is Flag(y)=1, the negative direction DWM is activated, and the current pulse thereof is a negative value. Continued with the step 1714, in step 1718, the state of the flag value is Flag(y)=0, so that the non-inversed burst data D_1-D_n is written into the memory cells of the memory unit. Continued with the step 1716, in step 1720, the state of the flag value is Flag(y)=1, so that the inversed burst data D_n-D_1 is written into the memory cells of the memory unit. In step 1722, the state of the flag value is correspondingly updated after the write operation.

Figure 18:
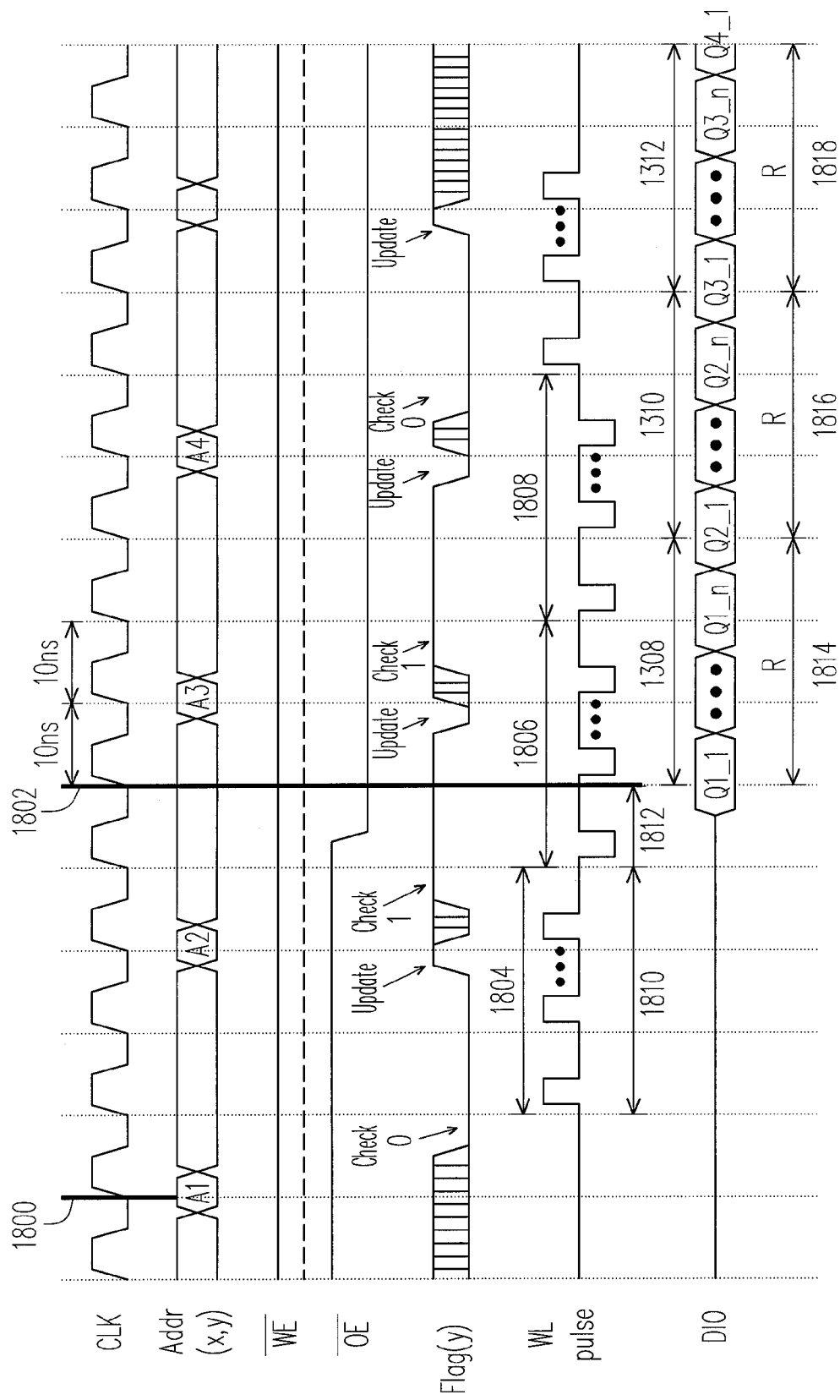
FIG. 18 is a timing diagram of read operation signals according to an embodiment of the present invention.

FIG. 18 is a timing diagram of read operation signals according to an embodiment of the present invention. Referring to FIG. 18, in the present embodiment, the sequence of the burst data is processed in the internal of the chip. The system, for example, performs the read operation in allusion to a plurality of the addresses A1-A4. After the address A1 is activated at a time point 1800, the read operation is determined according to the signals $\overline{WE}$ and $\overline{OE}$. Next, the flag value Flag(y) is first checked, and is updated after the read operation. Input of the operation current pulse (WL pulse) is performed according to the state of the flag value Flag(y). For example, n positive pulses are input during a time section 1804 corresponding to Flag(y)=0, n negative pulses are input during a time section 1806 corresponding to Flag(y)=1, and n negative pulses are input during a time section 1808 corresponding to Flag(y)=1, etc. Data sensing and data latching are performed during a time section 1810 corresponding to the operation current pulse (WL pulse), and during a time section 1812, whether the data sequence is inversed is determined according to the flag value. Therefore, the DIO pin outputs the burst data Q1_1-Q1_n during a time section 1814 corresponding to Flag(y)=0; outputs the burst data Q2_1-Q2_n during a time section 1816 corresponding to Flag(y)=1, outputs the burst data Q3_1-Q3_n during a time section 1818 corresponding to Flag(y)=1, and outputs the burst data Q4_1-Q4_n during a time section 1820 corresponding to Flag(y)=0. Namely, a first amount of the burst data is read at a time point 1802 after the time point 1800, and then the burst data is consecutively read without recovering the memory cells to the original positions, and the output sequence of the burst data is maintained to the conventional sequence.

Figure 19:
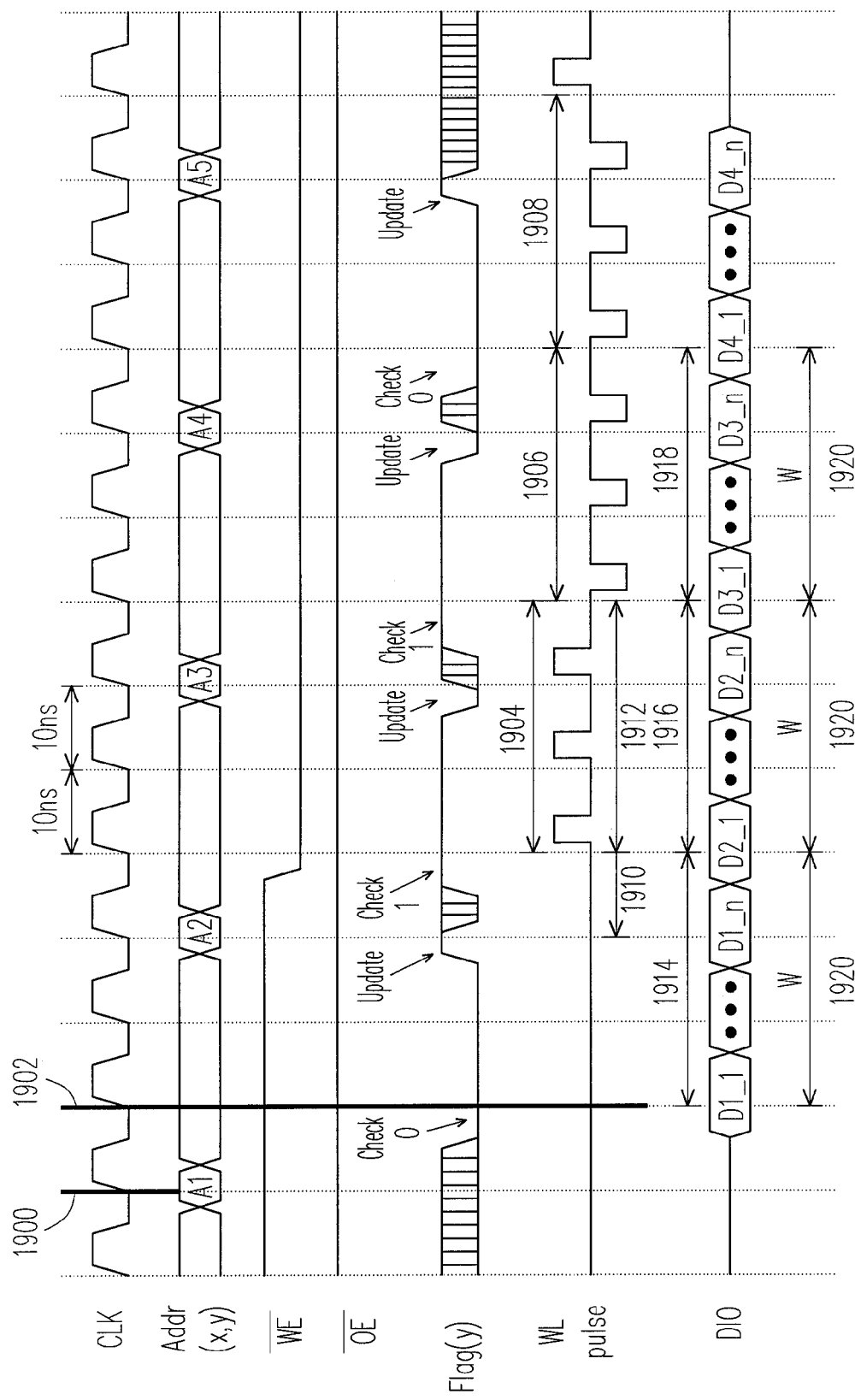
FIG. 19 is a timing diagram of write operation signals according to an embodiment of the present invention.

FIG. 19 is a timing diagram of write operation signals according to an embodiment of the present invention. Referring to FIG. 19, in the present embodiment, the sequence of the burst data is processed in the internal of the chip. The system, for example, performs the write operation in allusion to a plurality of the addresses A1-A4. After the address A1 is activated at a time point 1900, the write operation is determined according to the signals $\overline{WE}$ and $\overline{OE}$. Next, the flag value Flag(y) is first checked, and is updated after the write operation. Input of the operation current pulse (WL pulse) is performed according to the state of the flag value Flag(y). For example, n positive pulses are input during a time section 1904 corresponding to Flag(y)=0, n negative pulses are input during a time section 1906 corresponding to Flag(y)=1, and n negative pulses are input during a time section 1908 corresponding to Flag(y)=1, etc. The sequence of the input data is inversed according to the flag value during a time section 1910 corresponding to the operation current pulse (WL pulse). The current pulse is input during a time section 1912. The DIO pin inputs the burst data D1_1-D1_n, D2_1-D2_n, D3_1-D3_n, . . . , etc. during time sections 1914, 1916, 1918, . . . , etc., in which the conventional sequence of the burst data is maintained, and consideration of the corresponding Flag(y)=0 is unnecessary. The first amount of the burst data can be input at a time point 1902, and after the time section 1910, the write operation is performed.

Figure 1:
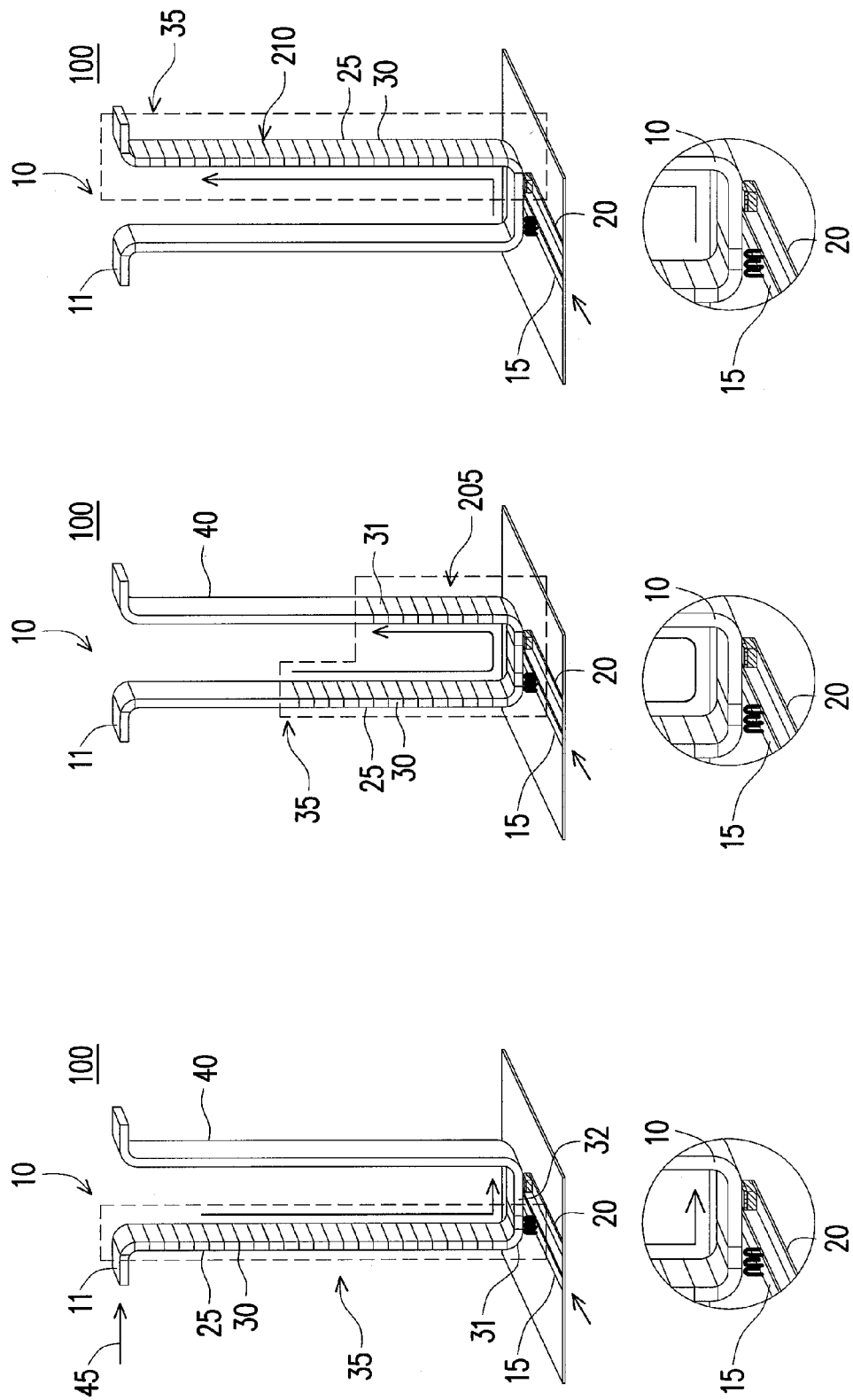
FIGS. 1A-1C are operational schematic diagrams of a conventional magnetic shift register memory.
Figure 2:
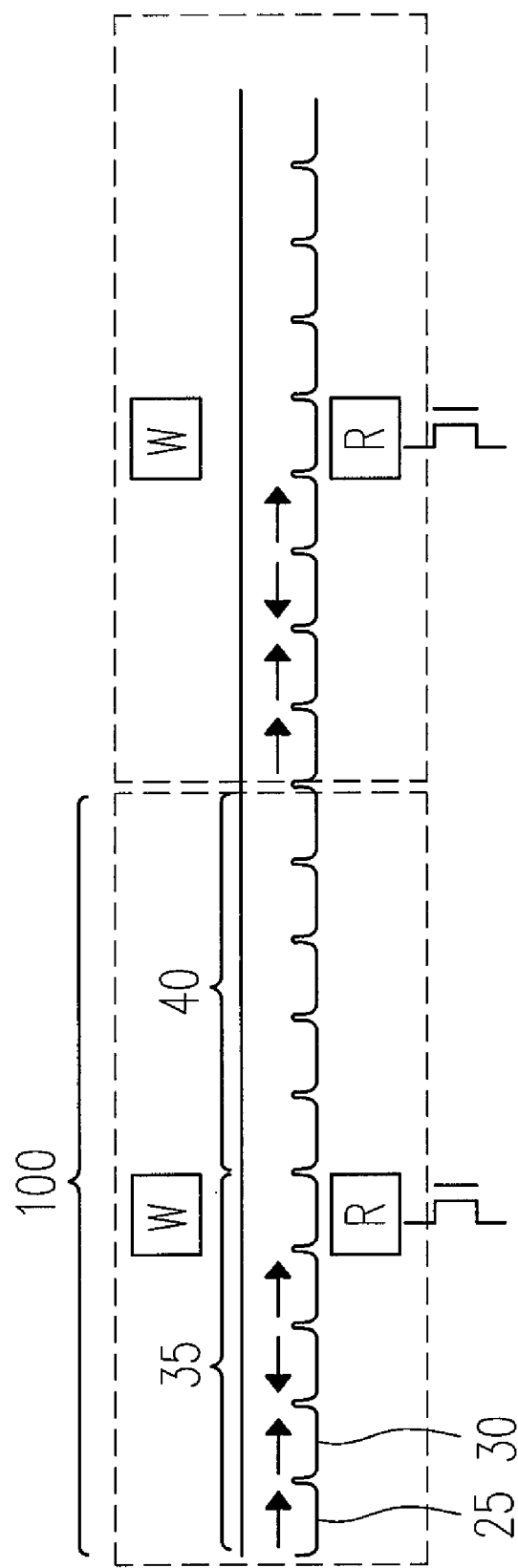
FIG. 2 is a schematic diagram illustrating a mechanism of a magnetic shift register of FIGS. 1A-1C.
Figure 3:
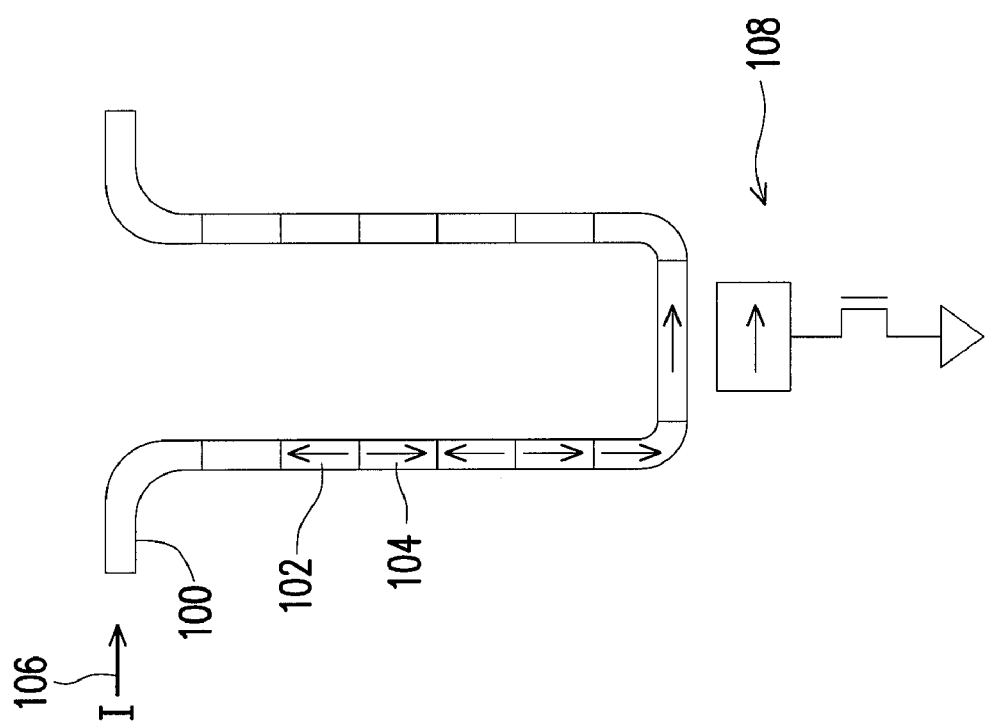
FIG. 3 is a schematic diagram illustrating a read mechanism.
Figure 4:
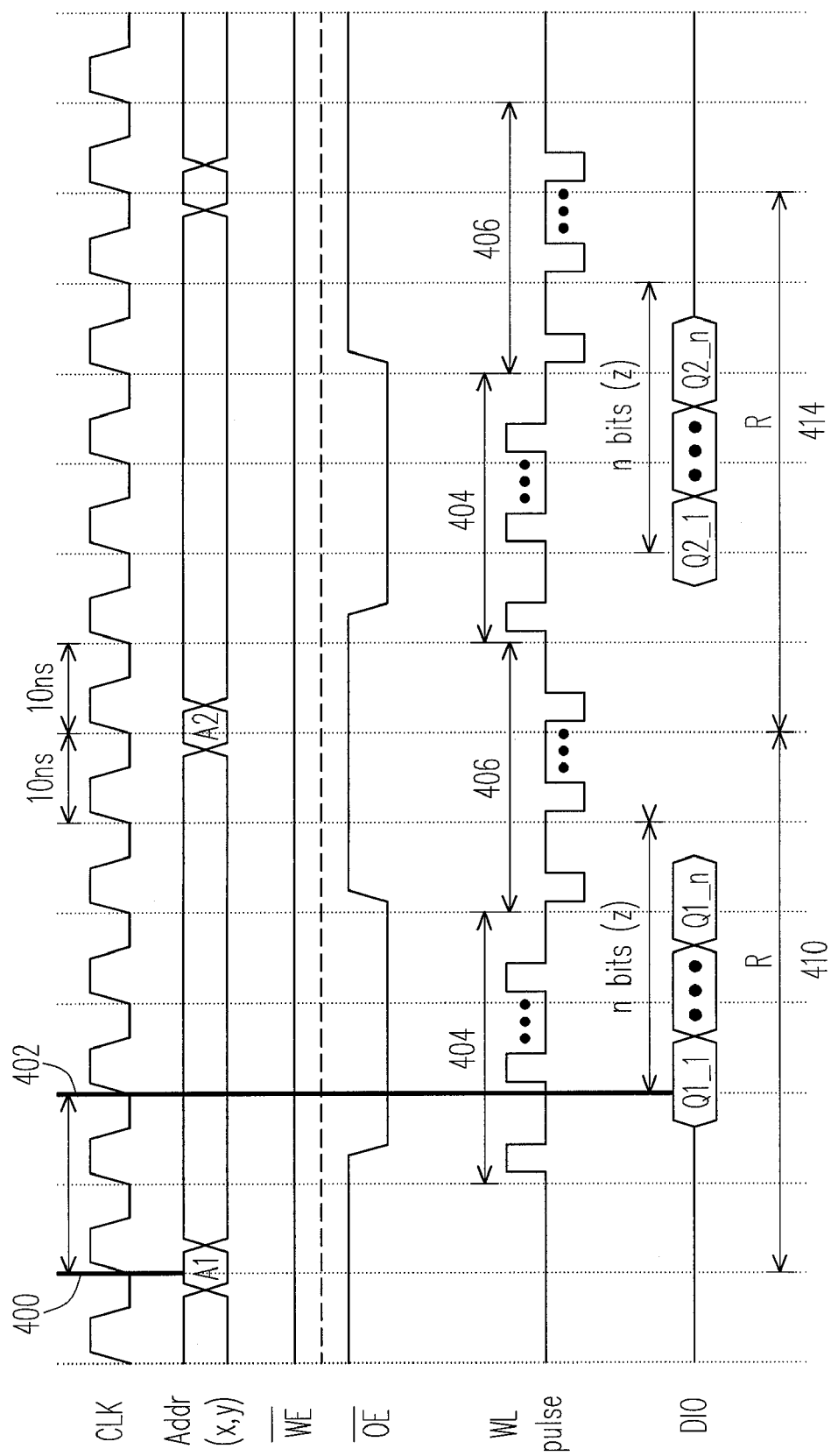
FIG. 4 is a schematic diagram illustrating a mechanism of a conventional read operation.
Figure 5:
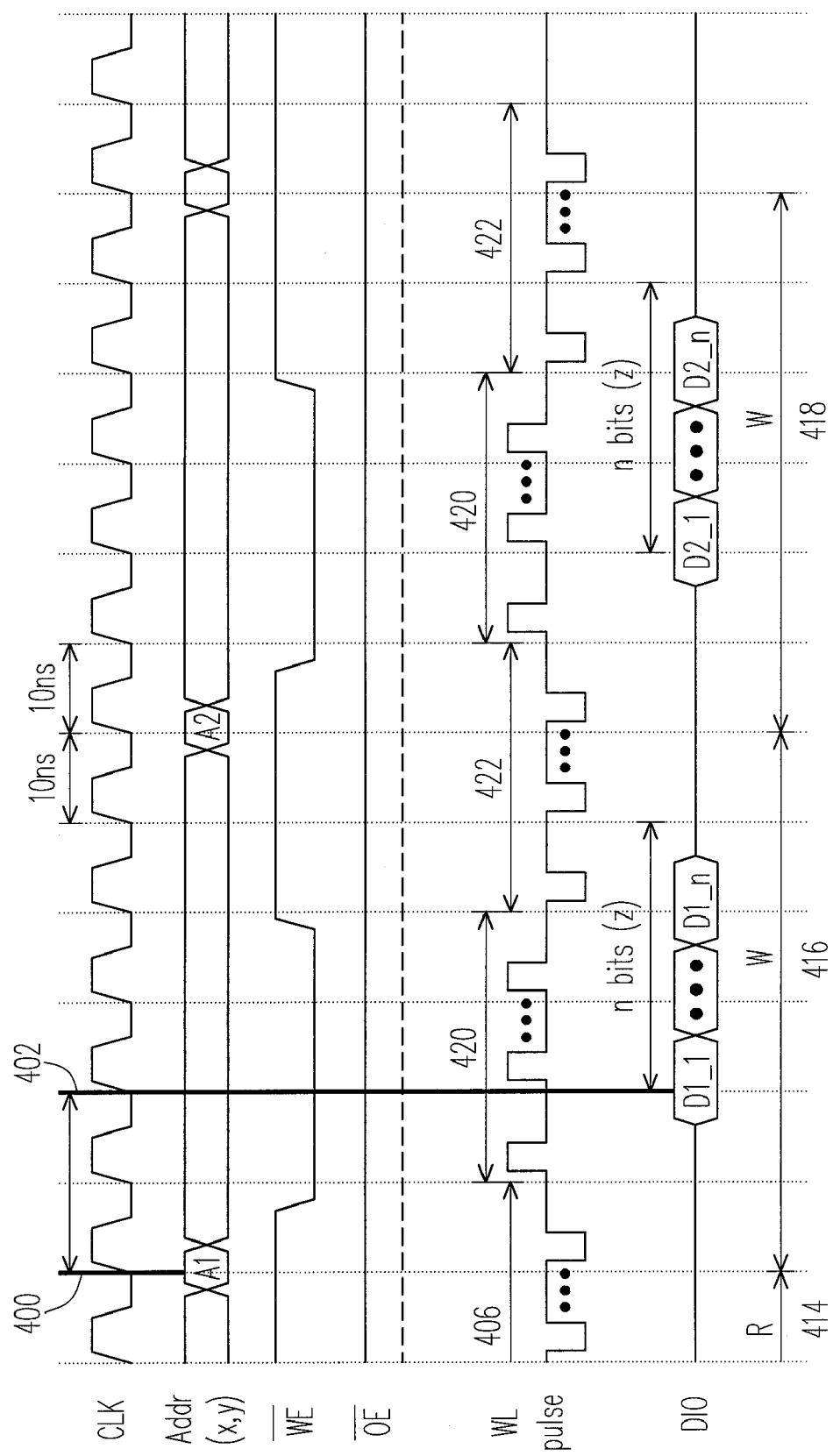
FIG. 5 is a schematic diagram illustrating a mechanism of a conventional write operation.
Figure 20:
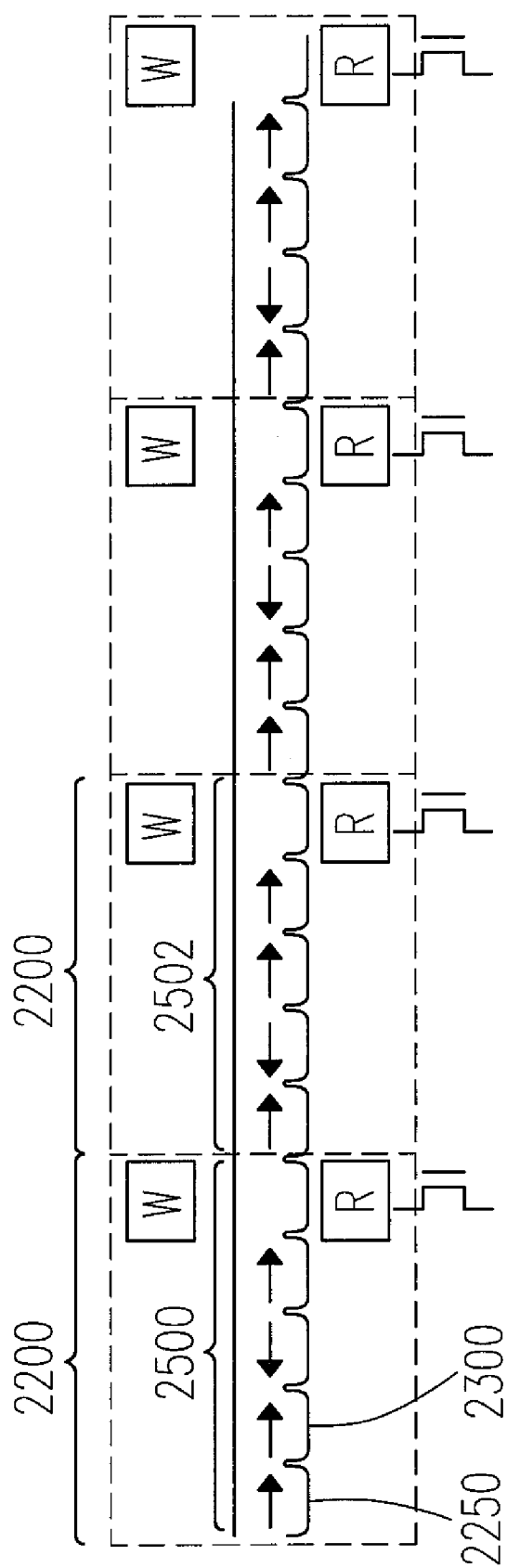
FIG. 20 is a schematic diagram illustrating a mechanism of a magnetic shift register memory according to an embodiment of the present invention.

The operation mechanism of the present invention is also suitable for being applied to other structures, and is not limited to the conventional structure shown in FIG. 1A-1C. For example, FIG. 20 is a schematic diagram illustrating a mechanism of a magnetic shift register memory according to an embodiment of the present invention. Referring to FIG. 20, the magnetic shift register memory 2200, for example, includes at least one magnetic memory track. In the present embodiment, one magnetic memory track is taken as an example, on which a plurality of the domain walls separates the magnetic memory track into a plurality of magnetic memory cells 2250 and 2300, wherein the domain walls are implemented by notches. By such means, a plurality of adjacent data regions is plotted in the memory cells. In the present embodiment, two data regions 2500 and 2502 are taken as an example, which are respectively formed by a fixed number of the magnetic memory cells to respectively store data of multiple bits. In the present embodiment, the data of four bits is taken as an example. One bit data in the magnetic memory cell is, for example, recorded by a direction of a magnetization vector. The data in the memory cells on the magnetic memory track can be shifted between the two adjacent data regions 2500 and 2502 under an operation current. Each of the data regions 2500 and 2502 for example, includes a read position (R) and a write position (W) to access the data of the magnetic domain shifted to the corresponding position. Preferably, the read position (R) and the write position (W) can be disposed at an edge position of the data region. Further, the read position (R) and the write position (W) can be located at the same position. In other words, the data region 2500 is a memory unit, in which application of a buffer region as that shown in FIG. 1A-1C is unnecessary.

Figure 21:
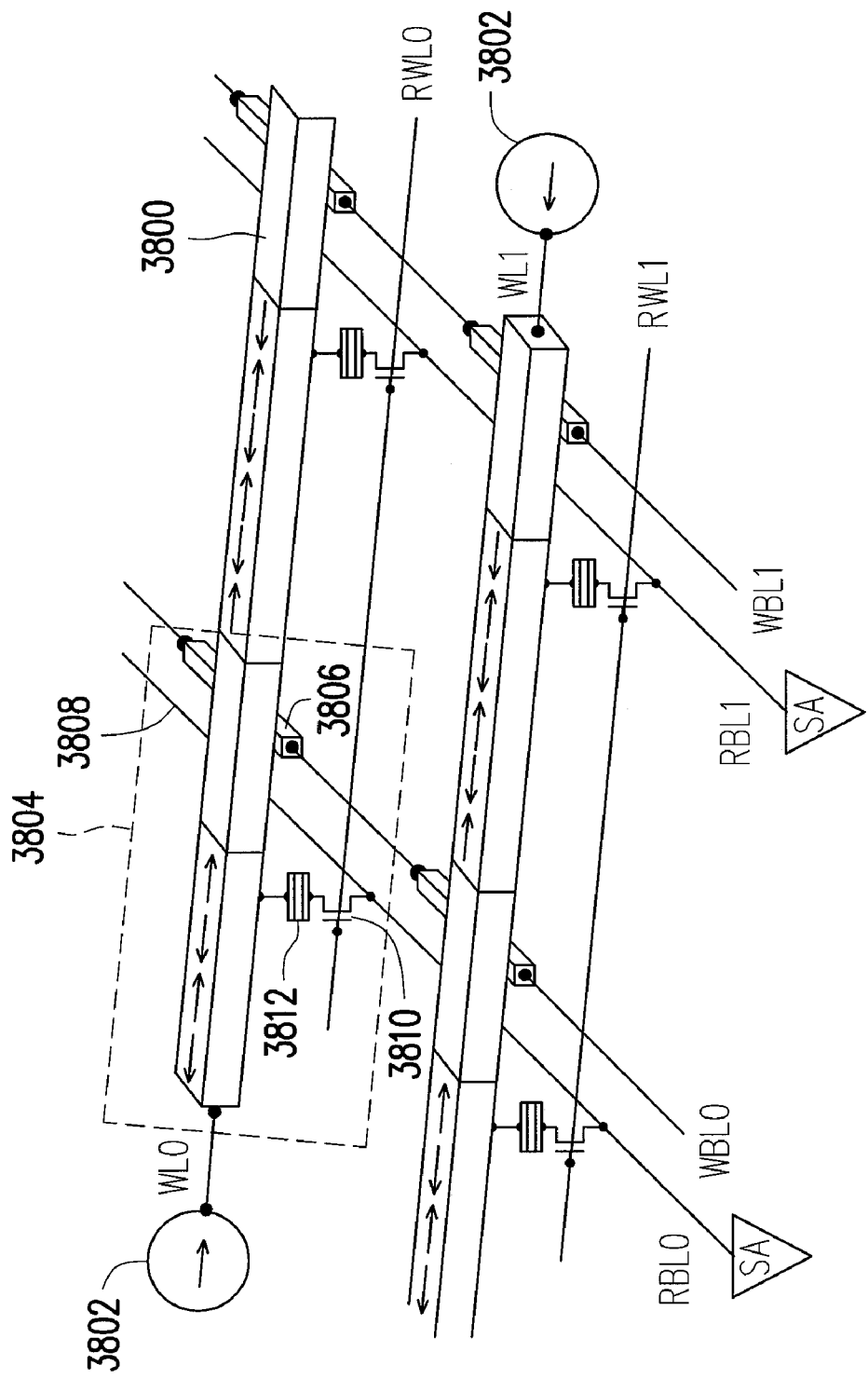
FIG. 21 is a schematic diagram illustrating a structure of a magnetic shift register memory according to an embodiment of the present invention.

FIG. 21 is a schematic diagram illustrating a structure of a magnetic shift register memory according to an embodiment of the present invention. Corresponding to the memory structure of FIG. 20, the magnetic shift register memory of the present embodiment includes a plurality of magnetic memory tracks disposed in parallel. Each of the magnetic memory tracks 3800 includes a plurality of magnetic memory cells separated by a plurality of the domain walls, which are shown as arrows of the magnetization vectors. A data region 3804 on each of the magnetic memory track 3800 is formed by a fixed number of the magnetic memory cells, and is used for storing data of multiple bits. The magnetic memory track 3800 can be briefly referred to as a track 3800.

A current driving unit 3802 applies an operation current to the selected magnetic memory track 3800 through write lines WL0, WL1, . . . , etc., so as to shift the magnetic memory cells of the data region 3804 to an adjacent data region. A read circuit unit includes a read circuit containing devices 3812 and 3810, and has a read position at each of the data regions for reading a bit data of a magnetic memory cell passing through the read position within the selected data region. A writing circuit unit includes a device 3806, and has a write position at each of the data regions for writing a bit data into a magnetic memory cell passing through the write position within the selected data region.

Taking the data region 3804 as an example, it is known that the data region 3804 is located at one side (for example, the left side) of the read device 3810 and the write device 3806 according to the flag value. After the read/write operation is performed to the data region 3804, the data region 3804 is shifted to the other side (for example, the right side) of the read device 3810 and the write device 3806, and the flag value is correspondingly updated. Therefore, the data region 3804 shifted to the right side is unnecessary to be shifted back to the original left side, so that an operation speed thereof is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic shift register memory, comprising:
   at least a magnetic memory track, having a plurality of domain walls separating the magnetic memory track into a plurality of magnetic domains to form a plurality of magnetic memory cells, and a fixed number of the magnetic memory cells forming a memory unit to store a burst data;

a read/write device, disposed between the memory units to read or write the burst data of the magnetic memory cells passing the read/write device;

a flag unit, recording a flag value for each of the magnetic memory tracks or each of the memory units to indicate whether the burst data is located at a first side or a second side of the read/write device; and a current unit, providing an operation current to the magnetic memory track according to the flag value to move the domain walls to pass the read/write device, wherein after the read/write device reads or writes the burst data, the flag value is updated.

2. The magnetic shift register memory as claimed in claim 1, wherein the flag unit is a non-volatile memory capable of continually maintaining and tracing the flag value.

3. The magnetic shift register memory as claimed in claim 1, wherein the flag unit is connected to an external system, and the external system adjusts a data sequence of the burst data according to the flag value.

4. The magnetic shift register memory as claimed in claim 3, wherein when the flag value indicates that a data sequence of the read or written burst data is required to be inversed, the external system inverses the burst data.

5. The magnetic shift register memory as claimed in claim 1 further comprising an internal memory processing unit, in which the burst data is first temporarily stored, and after a data sequence thereof is adjusted according to the flag value of the flag unit, the burst data is output or input.

6. The magnetic shift register memory as claimed in claim 1, wherein the flag unit is a volatile memory, and when a power of the magnetic shift register memory is turned off, each of the flag values and the burst data are recovered to an initial state.

7. The magnetic shift register memory as claimed in claim 1, wherein the memory unit does not contain a data buffer region, and the burst data is shifted back and forth in two adjacent memory units according to the flag value.

8. The magnetic shift register memory as claimed in claim 1, wherein each of the memory units contains two data buffer regions, wherein the burst data is recorded in one of the two data buffer regions, and the burst data is shifted back and forth in the two data buffer regions according to the flag value.

9. A method for accessing a magnetic shift register memory, wherein the magnetic shift register memory comprises at least one magnetic memory track having a plurality of domain walls separating the magnetic memory track into a plurality of magnetic domains to form a plurality of magnetic memory cells, wherein a fixed number of the magnetic memory cells forms a memory unit to store a burst data; and a read/write device disposed between the memory units, wherein the magnetic memory track or each of the memory units has a corresponding flag value indicating whether the burst data is located at a first side or a second side of the read/write device, the method comprising:

obtaining the flag value of the magnetic memory track or the memory unit to be read/written;

providing an operation current to the magnetic memory track to shift the domain walls to pass the read/write device according to the flag value;

reading or writing the burst data of the passed magnetic memory cells by the read/write device; and updating the flag value.

10. The method for accessing a magnetic shift register memory as claimed in claim 9, wherein the flag value is recorded in a non-volatile memory for being traced.

11. The method for accessing a magnetic shift register memory as claimed in claim 9 further comprising:

adjusting a data sequence of the burst data by an external system according to the flag value.

12. The method for accessing a magnetic shift register memory as claimed in claim 11, wherein when the flag value indicates that a data sequence of the read or written burst data is required to be inversed, the external system inverses the burst data.

13. The method for accessing a magnetic shift register memory as claimed in claim 9, wherein the burst data is first temporarily stored by an internal memory processing unit, and after a data sequence thereof is adjusted according to the flag value, the burst data is output or input.

14. The method for accessing a magnetic shift register memory as claimed in claim 9, wherein the flag unit is a volatile memory, and when a power of the magnetic shift register memory is turned off, the flag values and the burst data are recovered to an initial state.

15. The method for accessing a magnetic shift register memory as claimed in claim 9, wherein the memory unit does not contain a data buffer region, and the operation current shifts the burst data back and forth in two adjacent memory units according to the flag value.

16. The method for accessing a magnetic shift register memory as claimed in claim 9, wherein each of the memory units contains two data buffer regions, wherein the burst data is recorded in one of the two data buffer regions, and the burst data is shifted back and forth in the two data buffer regions according to the flag value.

* * * * *